United States Patent [19]
Wohl

[11] Patent Number: 6,148,436
[45] Date of Patent: Nov. 14, 2000

[54] SYSTEM AND METHOD FOR AUTOMATIC GENERATION OF GATE-LEVEL DESCRIPTIONS FROM TABLE-BASED DESCRIPTIONS FOR ELECTRONIC DESIGN AUTOMATION

[75] Inventor: Peter Wohl, Williston, Vt.

[73] Assignee: Synopsys, Inc., Mountain View, Calif.

[21] Appl. No.: 09/052,998

[22] Filed: Mar. 31, 1998

[51] Int. Cl.[7] .................................................. G06F 17/50
[52] U.S. Cl. .................................................. 716/18; 716/3
[58] Field of Search .......................... 395/500.19; 716/18

[56] References Cited

U.S. PATENT DOCUMENTS

| | | | |
|---|---|---|---|
| 5,243,538 | 9/1993 | Okuzawa et al. | 364/489 |
| 5,491,639 | 2/1996 | Filkorn | 364/488 |
| 5,493,508 | 2/1996 | Dangelo et al. | 364/489 |
| 5,754,454 | 5/1998 | Pixley et al. | 364/580 |
| 5,805,462 | 9/1998 | Poirot et al. | 364/490 |

OTHER PUBLICATIONS

Jennings, G., Accurate Ternary–Valued Compiled Logic Simulation of Complex Logic Networks by OTDD Composition, Proceedings of the 28th Annual Simulation Symposium, pp. 303–310, Apr. 1995.

Jennings, G., et al., Ordered Ternary Decision Diagrams and The Multivalued Compiled Simulation of Unmapped Logic, 27th Annual Simulation Symposium, pp. 99–105, Apr. 1994.

Jennings, G., Symbolic Incompletely Specified Functions for Correct Evaluation in the Presence of Indeterminate Input Values, System Sciences. Vol. II., Proceedings of the Twenty–Eighth Hawaii International Conference on., pp. 23–31, Jan. 1995.

Lindgren, P., Improved Computational Methods and Lazy Evaluation of the Ordered Ternary Decision Diagram, Design Automation Conference, 1995. Proceedings of the ASP–DAC '95/CHDL '95/VLSI '95., pp. 379–384, Aug. 1995.

Shin–ichi Minato, *Binary Decision Diagrams and Applications for VLSI CAD,* Kluwer Academic Publishers, 1996. (Title page and contents only).

R. E. Bryant, "Binary Decision Diagrams and Beyond: Enabling Technologies for Formal Verification," *International Conference on Computer–Aided Design,* Nov. 1995.

R. E. Bryant and Y. Chen, "Verification of Arithmetic Circuits with Binary Moment Diagrams," *32nd Design Automation Conference,* 1995.

R. Rudell, "Dynamic Variable Ordering for Ordered Binary Decision Diagrams," *International Conference on Computer–Aided Design,* Nov. 1993.

S. B. Akers. "Binary Decision Diagrams," *IEEE Transactions on Computers,* vol. C–27, No. 6, pp. 509–516, Jun. 1978.

*Primary Examiner*—Paul R. Lintz
*Assistant Examiner*—A. M. Thompson
*Attorney, Agent, or Firm*—Wagner Murabito & Hao LLP

[57] ABSTRACT

Automatic generation of gate-level descriptions from table-based descriptions within the field of electronic design automation. The gate-level and structural descriptions are used for test generation processes and some formal verification processes. For combinational table-based descriptions, ordered ternary decision diagram (OTDD) graphs are used with novel input reordering to extract prime, non-redundant cube sets that can include high level functions (e.g., XOR, XNOR, MUX). For sequential table-based descriptions, a reduced or "clock" based OTDD graph is generated from which data and clock signals are identified and characterized. Input reordering is done and a complete sequential OTDD graph is generated, followed by port separation and characterization of the sequential element. Clock and data functions are then constructed on a port-by-port basis using the prime, non-redundant cube set generation processes of the combinational logic phase. By providing an automatic generation process for the gate-level and structural descriptions, processes for verifying equivalence between the gate-level and structural descriptions and the table-based descriptions can be eliminated from the design phase.

27 Claims, 25 Drawing Sheets

Primitive mux_cand(mux, da, db, ca, cb); ⎤
Output mux;                              ⎬ — 335
Input ca, cb, da, db;//control is ca * !cb ⎦
Table         ← — 345
// da db ca cb : mux
  0  ?  0  ?  : 0; // da input selected:
  1  ?  0  ?  : 1;
  0  ?  ?  1  : 0;
  1  ?  ?  1  : 1;
  ?  0  1  0  : 0; // db input selected:
  ?  1  1  0  : 1;
  0  0  ?  ?  : 0; // da == db, select don't care:
  1  1  ?  ?  : 1;
Endtable
Endprimitive 212a

FIG. 6

```
Module mux_cand(mux, da, db, ca, cb);
Input da, db, ca, cb;
Output mux;
Wire_or0;
  _OR_or0 (cb, !ca,_or0)
  _MUX_mux1 (_or0,db, da, mux);
Endmodule
```

490

```
Primitive dlat_qualR(q,d,a,ck,rb);;          ⎤
Output q; reg q; input d,a,ck,rb;            ⎦ — 570
Table
// d a ck rb : qt : qt+1
   ? ? 0  1  : ? :-; // all clocks off
   ? 0 ?  1  : ? :-;
   ? ? 0  0  : ? :0; // reset
   ? 0 ?  0  : ? :0;        577
   0 ? ?  0  : ? :0;
   ? 0 ?  ?  : 0 :0; // possible reset
   ? ? 0  ?  : 0 :0;
   0 1 1  ?  : ? :0; // capture 0
   1 1 1  1  : ? :1; // capture 1
   0 ? ?  ?  : 0 :0; // possible capture0
   1 ? ?  1  : 1 :1; // possible capture1
Endtable
Endprimative
                                             212b
```

515

```
Module dlat_qualR (q, d, a, ck, rb);
Input d, a, ck, rb;
Output q;
Wire_and1;
   _DLAT_dlat0 (0, !rb,_and1,d,q);
   _AND_and1 (ck, a,_and1);
Endmodule
```

885

```
Primitive xdet (out, a,b);
Output out; input a, b;
Table
    //  a   b   :out
        0   x   :0;
        0   0   :1;
        0   1   :0;
Endtable
Endprimitive
```

FIG. 23A

```
Primitive dlat_qualR(q,d,a,ck,rb);
Output q; reg q; input d,a,ck,rb;
Table
// d a ck rb : qt: qt+1
    ?  ?  0  1   : ? : -;  // all clocks off
    ?  0  ?  1   : ? : -;
    ?  ?  ?  0   : ? : 0;  //>>>>a=?<<<<
    ?  ?  ?  x   : ? : -;  //>>>>rb=x<<<<
    ?  0  ?  ?   : 0 : 0;  // possible reset
    ?  ?  0  ?   : 0 : 0;
    0  1  1  ?   : ? : 0;  // capture 0
    1  1  1  1   : ? : 1;  // capture 1
    0  ?  ?  ?   : 0 : 0;  // possible capture 0
    1  ?  ?  1   : 1 : 1;  // possible capture 1
Endtable
Endprimitive
```

FIG. 23B

SYSTEM AND METHOD FOR AUTOMATIC GENERATION OF GATE-LEVEL DESCRIPTIONS FROM TABLE-BASED DESCRIPTIONS FOR ELECTRONIC DESIGN AUTOMATION

BACKGROUND OF THE INVENTION

1. Field of the Invention

The present invention relates to the field of electronic design automation (EDA). More specifically, the present invention relates to techniques for producing gate-level and structural descriptions used in a computer controlled EDA system for integrated circuit (IC) design.

2. Related Art

An electronic design automation (EDA) system is a form of computer aided design (CAD) system and is used for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on library primitives. The generic netlist can be translated into a lower level technology-specific netlist based on a technology-specific library. A netlist describes the IC design and is composed of nodes (elements) and edges, e.g., connections between nodes, and can be represented using a directed cyclic graph structure having nodes which are connected to each other with signal lines. A single node can have multiple fan-ins and multiple fan-outs. The netlist is typically stored in computer readable media within the EDA system and processed and verified using many well known techniques. One result is a physical device layout in mask form which can be used to directly implement structures in silicon to realize the physical IC device.

FIG. 1 illustrates a typical design flow 10 for the design of integrated circuits (e.g., ASIC, microprocessors, microcontrollers, etc.). This IC design flow 10 requires several equivalent descriptions of the design library that are used as input to different CAD tools. In the prior art system 10, a set of hand-coded descriptions of low-level design cells is referred to as a "library." For instance, a simulation library 12 and a test library 22 are shown. Because these libraries 12 and 22 are hand-coded, significant effort is expended in creating these libraries 12 and 22, verifying their equivalence, and maintaining multiple sets of descriptions across various versions of the same IC design. Hand-coding is not only time consuming, but is often error-prone and leads to incomplete modeling. It would be advantageous to reduce the effort required to generate a library within an IC design process to thereby reduce IC design time, reduce cost and increase IC design accuracy.

The main loop in the IC design environment 10 of FIG. 1 consists of: describing the IC design in terms of primitive models from the simulation library 12; verifying through simulation 16a or emulation 16b; and refining and correcting the IC design. In typical CAD design flows, the table-based library 12 is the "golden" (sign-off) simulation library 12 upon which the downstream IC design is based. A large percentage of the library development effort is invested in coding and verifying custom or special function cells that cannot be easily represented by traditional gates such as AND, OR, and are naturally encoded as look-up tables. These look-up tables are called table-based descriptions 14 and are stored in the simulation library 12. The tables 14 are created in the target simulator's language; for example user-defined primitive (UDP) tables in Verilog or VITAL tables in VHDL as described in: IEEE Standards Department, "IEEE Standard VHDL Language Reference Manual," IEEE-1076-1987, IEEE, NY, 1988; IEEE Standards Department, "Verilog Hardware Description Language," IEEE-1364, 1994; and IEEE Standards Department, "Standard VITAL ASIC Modeling Specification," IEEE P1076.4, July 1995.

As shown in FIG. 1, the first library 12 may be used for simulation 16a, emulation 16b and verification 16c, however, an equivalent structural "test" library 22 is needed for test generation 20a and formal verification 20b. The structural library 22 is needed because tools such as test generation 20a and formal verification 20b do not directly accept simulation-table models 14, which would significantly complicate processes such as back-justification and learning. Therefore, the secondary test library 22 is created to support test generation processes 20a and formal verification 20b. Unfortunately, the most engineering-time consuming process of the IC design process 10 is manually translating (e.g., hand-coding) the table-based models 14 (akin to truth-tables) from the simulation library 12 into structural models 24 in the test library 22. The manual translation is labor intensive and error prone and involves explicitly instantiating gates and manually connecting the gates into an equivalent structure. Moreover, once the manually generated structural models 24 are generated, they require verifying their logical equivalence 18, which consumes additional design time. It would be advantageous to make the above IC design process 10 more efficient and cost effective.

Accordingly, what is needed is a system and method for reducing the complexity of an IC design process by eliminating and/or increasing the efficiency of one or more steps of the IC design process. What is also needed is a system and method for reducing the amount of hand-coded descriptions required in the IC design process. In view of the above needs, the present invention provides a system and method for increasing the efficiency of an IC design process to thereby provide a faster, more cost effective and more accurate IC design process. These and other advantages of the present invention not specifically mentioned above will become clear within discussions of the present invention presented herein.

SUMMARY OF THE INVENTION

A system and method are described for automatic generation of gate-level descriptions from table-based descriptions within the field of electronic design automation. Integrated circuits (ICs) are designed using descriptions that include primitive models stored in a "simulation library" upon which the downstream IC design is based. The present invention provides an automatic process for generating gate-level descriptions and structural descriptions of table-based descriptions of the simulation library. The gate-level and structural descriptions are required for test generation processes and some formal verification processes. By providing an automatic generation process for the gate-level and structural descriptions, processes for verifying equivalence between the gate-level and structural descriptions and the table-based descriptions are eliminated from the design phase.

For combinational table-based descriptions, the present invention utilizes ordered ternary decision diagram (OTDD) graphs with novel input reordering to extract prime, non-redundant cube sets that can include high level functions (e.g., XOR, XNOR, MUX). For sequential table-based descriptions, a reduced or "clock" based OTDD graph is generated from which data and clock signals are identified and characterized. Input reordering is done and a complete sequential OTDD graph is generated, followed by port separation and characterization of the sequential element (e.g., latch, flip-flop, 2-latches). Clock and data functions are then constructed on a port-by-port basis using the prime, non-redundant cube set generation processes of the combinational logic phase.

Specifically, an embodiment of the present invention includes a computer implemented method for generating a gate-level description of an integrated circuit cell, the method comprising the steps of: a) accessing a simulation library to obtain a table-based description of the integrated circuit cell, the simulation library stored in a memory unit; b) determining whether the table-based description describes a combinational circuit or a sequential circuit; c) provided the table-based description describes a combinational circuit, automatically generating a complete combinational ordered ternary decision diagram (OTDD) graph of the table-based description and automatically generating a gate-level description of the table-based description based on the complete combinational OTDD graph; d) provided the table-based description describes a sequential circuit, automatically generating a gate-level description of the table-based description based on a generated clock OTDD graph of the table-based description and also based on a generated complete sequential OTDD graph of the table-based description; and e) storing the gate-level description of the table-based description in a first library stored in the memory unit.

BRIEF DESCRIPTION OF THE DRAWINGS

FIG. 6 is an exemplary table-based description of a combinational logic element of the simulation library.

FIG. 23A illustrates a description of a combinational X-detector in accordance with the present invention.

FIG. 23B illustrates an ambiguous table-based description identified by the design rule checking processing of the present invention.

DETAILED DESCRIPTION OF THE INVENTION

Figure 1:
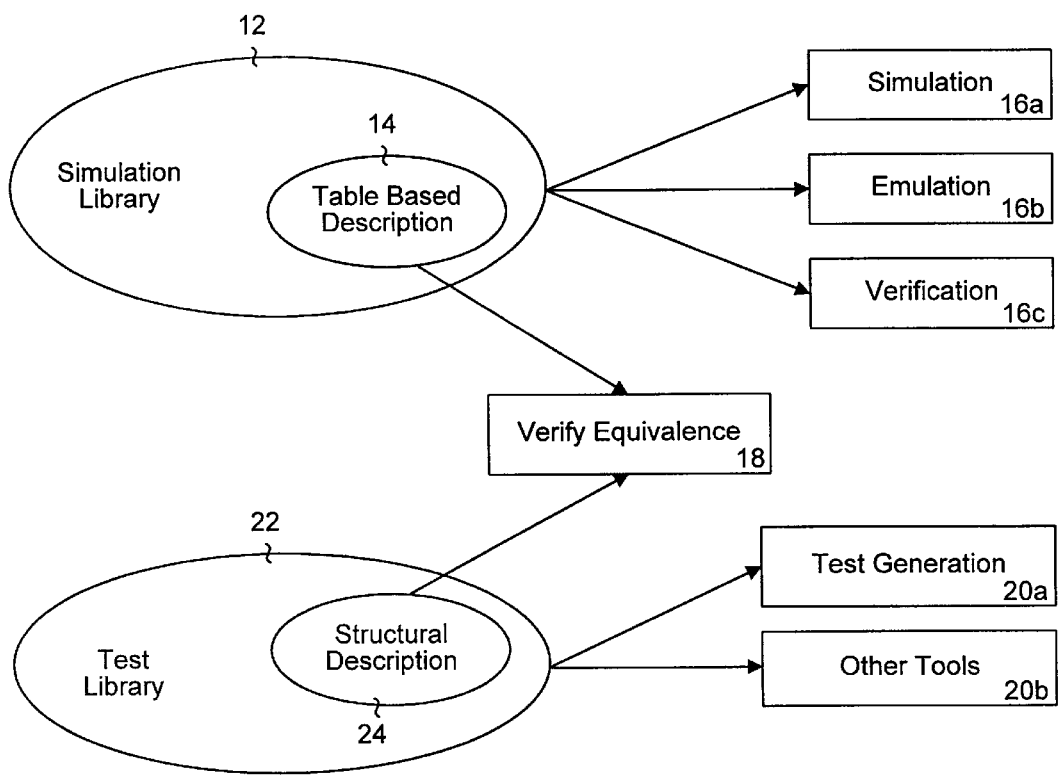
FIG. 1 illustrates a typical prior art integrated circuit (IC) design flow including manual generation of the structural descriptions within a test library and an equivalence verification step.

In the following detailed description of the present invention, a system and method for automatic generation of gate-level descriptions from table-based descriptions within the field of electronic design automation, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system (e.g., FIG. 2), or similar electronic computing device, that manipulates and transforms data represented as physical (electronic) quantities within the computer system's registers and memories into other data similarly represented as physical quantities within the computer system memories or registers or other such information storage, transmission or display devices.

Computer System Platform 112

Aspects of the present invention, described below, are discussed in terms of steps executed on a computer system (e.g., processes 230, 260, 315, 320, 265, 515, 545, 550 and 270). These steps are implemented as program code stored in computer readable memory units of a computer system and are executed by the processor of the computer system. Although a variety of different computer systems can be used with the present invention, an exemplary general purpose computer system 112 is shown in FIG. 2.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. Memory units of system 112 include 102, 103 and 104.

Figure 2:
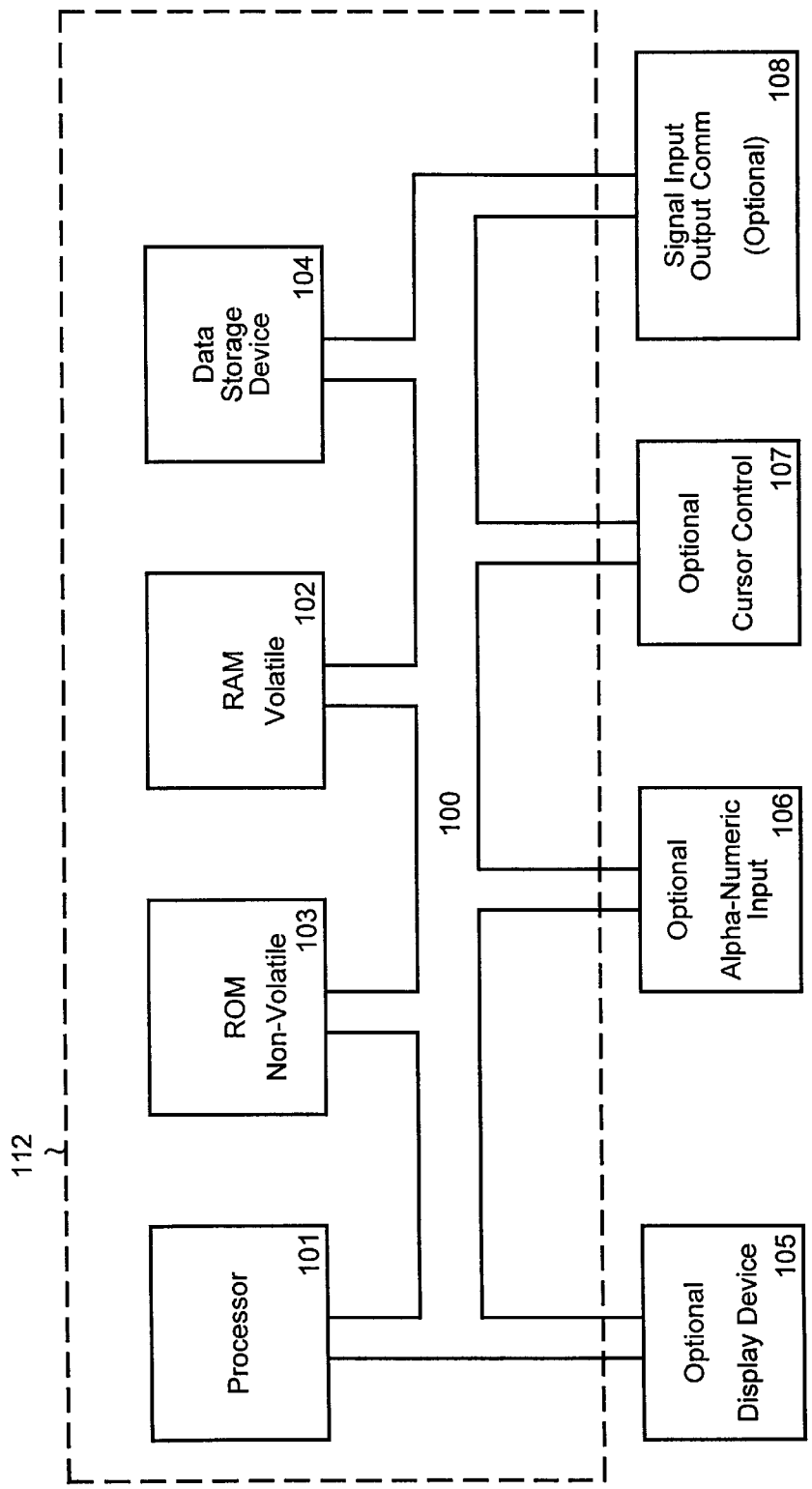
FIG. 2 is a general purpose computer system which provides an operational platform for embodiments of the present invention.

Also included in computer system 112 of FIG. 2 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

Figure 3:
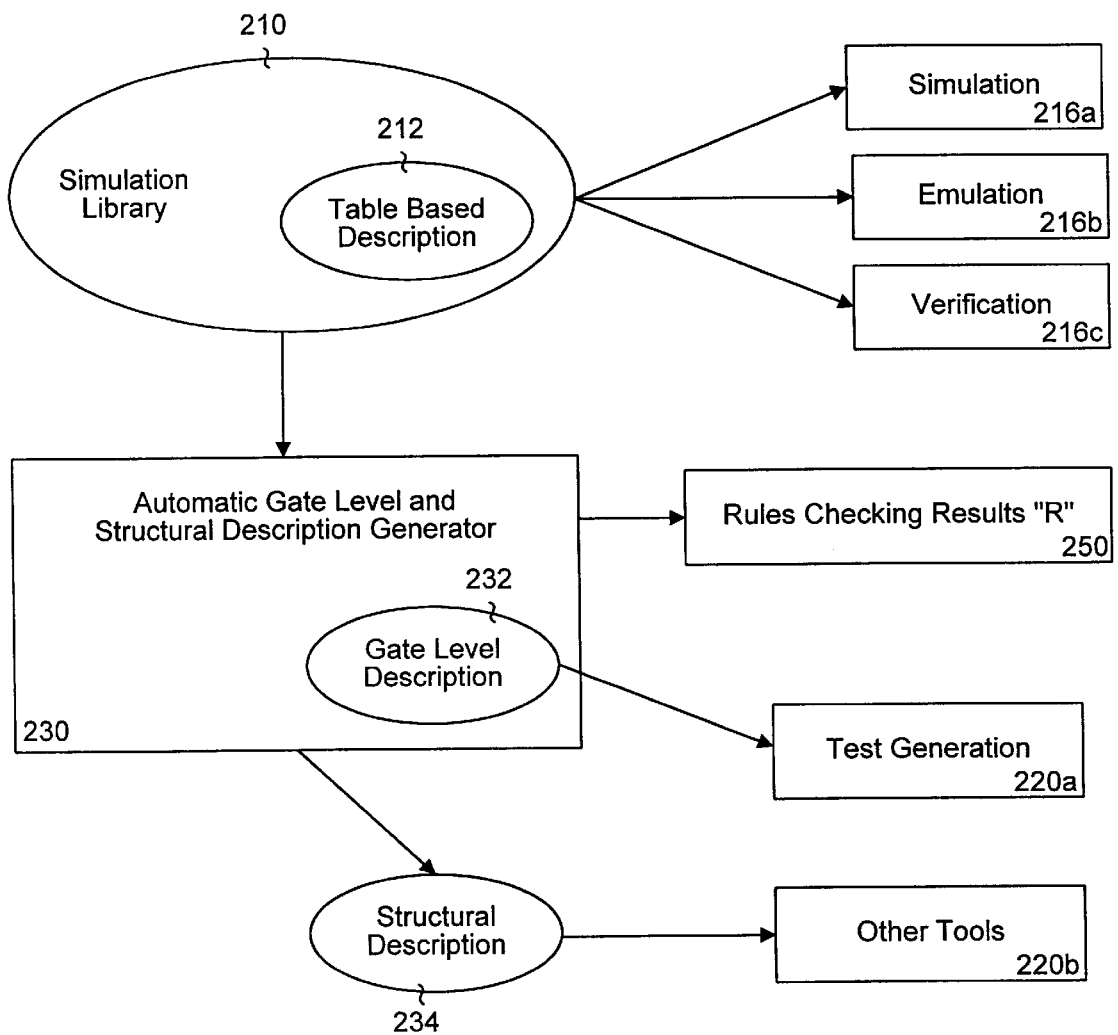
FIG. 3 illustrates an IC design flow in accordance with the present invention including an automatic process for generating gate-level and structural descriptions of table-based descriptions of the simulation library.

Automatic Gate-level and Structural Description Generation Process of the Present Invention FIG. 3 illustrates an IC design process 200 in accordance with the present invention. The automatic gate-level and structural description generator 230 ("automatic generator") of the present invention is a process that reads existing simulation libraries 210 and automatically converts table-based descriptions ("models") 212 into efficient gate-level descriptions 232 for use by test-generation tools 220a and also generates structural level descriptions 234 for use by other tools 220b (e.g., formal verification), thereby effectively automating what was the most engineering-intensive task of library development.

It is appreciated that the verification of equivalents process 18 (of FIG. 1) is eliminated in the IC design process 200 of the present invention because the gate-level descriptions 232 and the structural level descriptions 234 are automatically generated by the automatic generator 230. The goal of the automatic generator 230 of the present invention is to minimize or eliminate the engineering effort in creating gate-level descriptions 232 and structural descriptions 234 that mirror the table based description 212, therefore, separate equivalence verification of the two libraries is not necessary.

The simulation library 210 is the "golden" (e.g., sign-off) library upon which the downstream design is based. The gate-level description 232 and the structural descriptions 234 of the structural library are needed because tools such as test generation 220a and formal verification 220b do not directly accept simulation-table models. However, with the automatic generator 230 of the present invention, the table-based descriptions 212 (for example, Verilog UDPs or VITAL tables) are parsed and efficient gate-level models 232 are created that can be used directly for test generation. These automatically generated gate-level models 232 can also be written out in accordance with the present invention as a structural description 234, for use by other tools such as formal verification 220b. The automatic generator 230 also outputs comprehensive rules checking results 250 that offer significant help in modifying the table representations 212 to eliminate errors and ambiguities and, in general, writing a more accurate model.

In performing the automatic generation of gate-level and structural descriptions 232 and 234, the automatic generator 230 handles two significant tasks. First, a large number of table-based libraries 212 have already been written and are used by many large vendors in their design flows. These library models 212 cannot be changed, regardless of how insightful the rules checking results might be. The automatic generator 230 reads these libraries "as is." Second, most table-based models 212 have been written as a table because they do not have an exact gate-level representation. When hand-coding an "equivalent" structural model, engineers ignore certain functionality not pertinent to the target tool, e.g., test generation. The automatic generator 230 of the present invention infers sufficient high-level understanding of the table 212 to decide which subset of its functionality is to be included in the gate-level model 232 created.

From a theoretical point of view, automatically translating a table-based model 212 into a gate-level model 232 is an open-ended task. Table modeling provides almost unlimited freedom, to the extent that some models may have no gate-level equivalence or may even be physically unrealizable. This is frequently encountered with models that include some secondary functionality intended only for some simulation checking (such as timing violations) and not for physical implementation. Also, a particular model may be obscure or physically unrealizable by itself, but can be straightforward in a particular context, e.g., connected in a specific way to certain other modules. The automatic generator 230 performs a context-free translation because, in most cases, it does not know the table-model usage. Fortunately, from a practical point of view, the majority and, in many cases, all simulation-library models 212 can be translated into efficient gate-level equivalents 232.

High Level Flow of Automatic Generator 230

Figure 4:
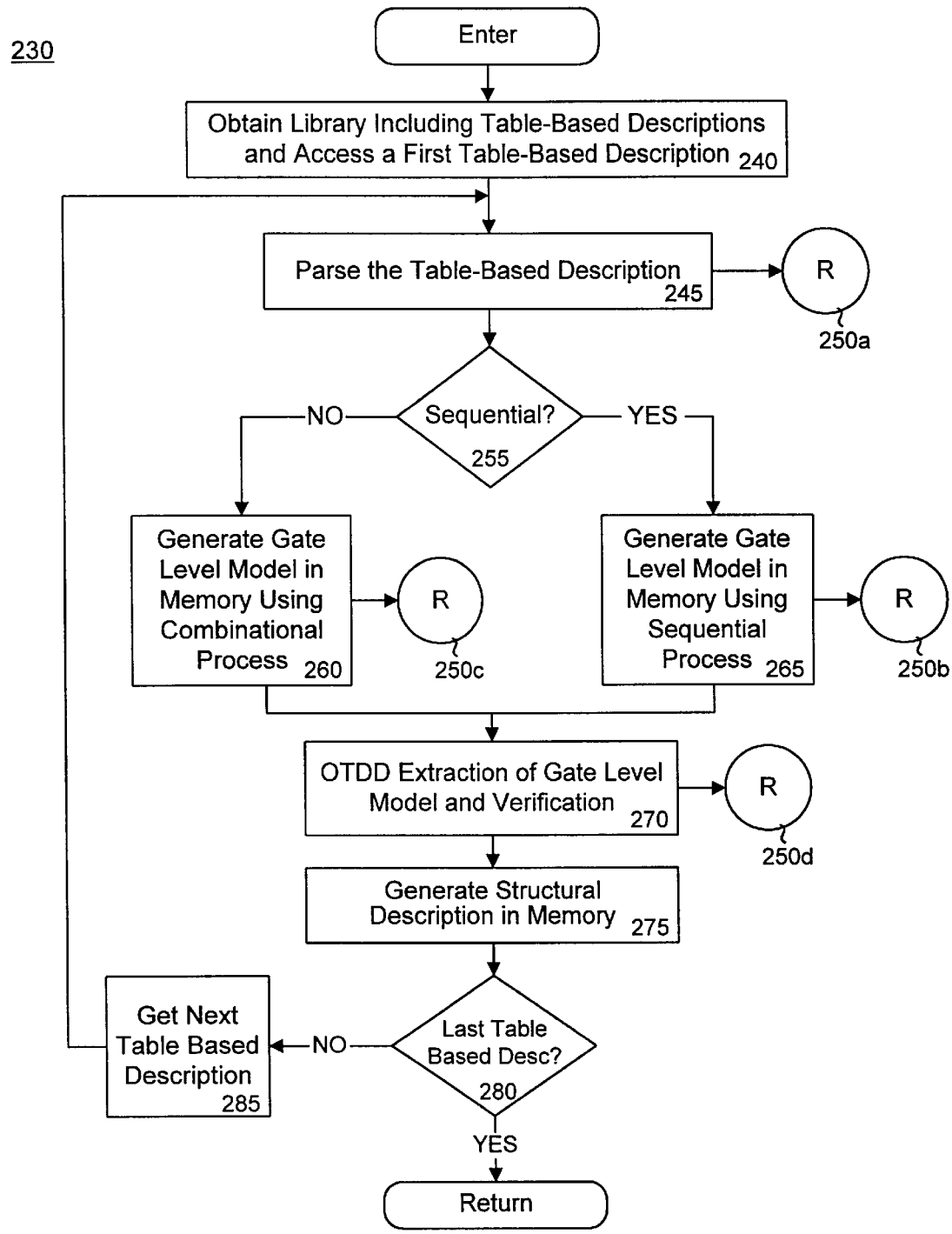
FIG. 4 is a high level flow diagram illustrating steps of the automatic process of the present invention for generating gate-level and structural descriptions of table-based descriptions of the simulation library.

FIG. 4 illustrates a high level flow chart of the steps performed by the computer implemented automatic generator 230 of the present invention. As shown in FIG. 4, the automatic generator 230 is a process including steps performed by computer system 112. It is appreciated that many of the steps of automatic generator 230 are described in further detail by other figures. Process 230 of the present invention commences at step 240 where the table-based descriptions 212 of the simulation library 212 are accessed and a current table-based description is obtained.

Figures 14, 15:
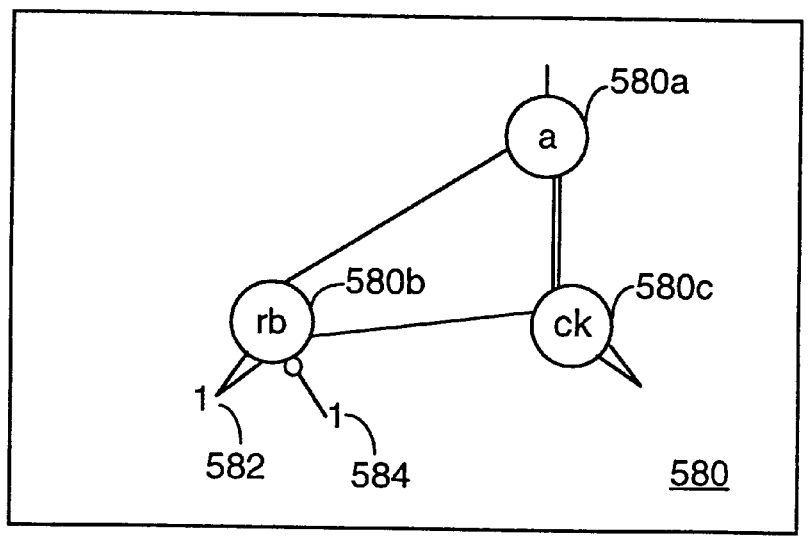
FIG. 14 is an exemplary table-based description of a sequential logic element of the simulation library.
FIG. 15 is a graph representation of a reduced or "clock" OTDD of the exemplary table-based description of FIG. 14 in accordance with the present invention.

FIG. 6 illustrates an exemplary combinational table-based description 212a (also hereinafter called a user-defined primitive UDP) that can be accessed via step 240. Note that FIG. 14 illustrates an exemplary sequential UDP 212b. FIG. 6 shows the Verilog UDP 212a of a combinational model that can be thought of as a multiplexer with data input "da" and "db," where "da" is selected if ca*!cb is 0 and "db" is selected when ca*!cb is 1. The combinational UDP 212a contains a header section 335, a recitation of input signal names 345, and a look-up function section 340 that defines the output of the function for a given combination of input signal values. The symbol "?" and the symbol "x" represent a don't care or unknown value. The header section 335 of a UDP indicates whether or not the UDP is a combinational or a sequential circuit type. In this case, the output (mux) is a wire (as opposed to a reg) which signifies a combinational UDP 212a.

At step 245 of FIG. 4, the automatic generator 230 parses the header section 335 of the current UDP 212 selected by step 240 to determine whether or not the current UDP 212 is a sequential circuit. A number of well known techniques and methods can be applied at step 245. Step 245 also generates certain design rule checking results 250a. Design rule checking and its results are discussed further below with respect to FIG. 23A and FIG. 23B and are output from several steps to aid in fixing or enhancing the current table-based description. At step 255, if the current UDP 212 models a sequential circuit, then step 265 is entered, otherwise step 260 is entered to process the current UDP 212 as a combinational circuit model.

At step 260, the present invention utilizes data structures stored in memory that are based on ordered ternary decision diagrams (OTDDs) to automatically transform the current UDP into a gate-level combinational description 232 (e.g., circuit model). The gate-level combinational description 232 is then stored in a test library in computer memory. Certain rules checking results 250c are also generated by step 260. Step 270 is then entered. Sequential UDPs are processed by step 265. At step 265, the present invention utilizes a first reduced OTDD (also called "clock" OTDD) graph to perform clock identification and characterization and then utilizes another, complete, sequential OTDD graph to automatically transform the current UDP into a gate-level sequential description 232 (e.g., circuit model). The gate-level sequential description 232 is then stored in a test library in computer memory. As described further below, certain portions of step 265 process the current UDP on a port-by-port basis. Certain rules checking results 250b are also generated by step 265. Step 270 is then entered.

Step 270 of FIG. 4 is optional. At step 270, the present invention automatically generates a second OTDD graph based on the gate-level description generated by either step 260 or step 265 (which was generated based on the current UDP) and then compares the two OTDDs for differences in functionality. Certain rules checking results 250d are also generated. If the above comparison locates a difference, the generated gate-level description may be replaced by a "black-box" model. Specifically, if the two OTDDs do not match and the extracted gate level model is deemed unsuitable for test generation or fails to reflect necessary functionality of the table, the current gate level model is replaced by a "black box." If the gate-level description passes, then the gate-level description can be used directly for test generation or can be written out as a structural netlist.

At step 275, the present invention then accesses the gate-level description generated by either step 260 or step 265 and generates a structural level description 234 and stores this structural description in a structural library in memory. The structural library and the test library can be the same. It is appreciated that a number of well known methods and techniques can be used within the present invention to perform step 275.

At step 280 of FIG. 4, the present invention determines whether or not another UDP is available within the simulation library 210. If not, the automatic generator 230 returns. If more UDPs are available for processing, then at step 285, a next UDP is obtained from the simulation library 210 and process 230 returns to step 245 to generate another gate-level and structural-level description.

Combinational UDP Processing

Figure 5:
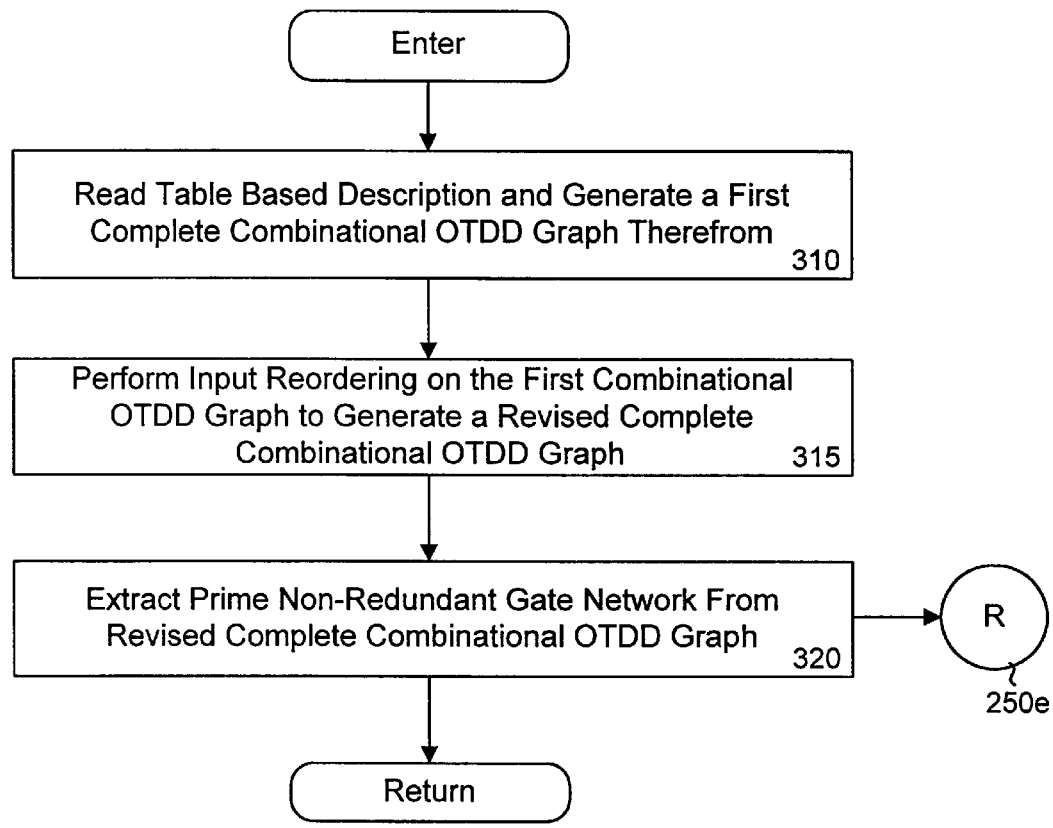
FIG. 5 is a high level flow diagram illustrating steps of the automatic process of the present invention applicable to transforming combinational table-based descriptions into gate-level descriptions.

Step 260 of FIG. 4 is now described in further detail with reference to the steps of FIG. 5. FIG. 5 is a flow diagram illustrating steps of the automatic process 230 of the present invention applicable to transforming combinational table-based descriptions into gate-level descriptions. At step 310, the current UDP 212a is read and a first complete combinational OTDD is generated.

An OTDD. The internal data structures used by the automatic generator 230 of the present invention are ordered ternary decision diagrams (OTDD). CAD tools have used ordered binary decision diagrams (OBDD) as described in: Shin-ichi Minato, "Binary Decision Diagrams and Applications for VLSI CAD," Kluwer Academic Publishers, 1996; and R. E. Bryant, "Binary Decision Diagrams and Beyond: Enabling Technologies for Formal Verification," International Conference on Computer-Aided Design, November 1995. The present invention extends the OBDD to an OTDD to implement the automatic generator 230.

An OTDD is a graph representation of a ternary-valued function: a function of variables that can assume the values 0, 1 or x (don't care). FIG. 7B illustrates an exemplary node of an OTDD graph. Each non-terminal node 376 in a ternary decision diagram represents an input and has three outgoing edges 378a, 378b and 378c, corresponding to the cases where the input, indicated in the node, evaluates to 0, x or 1, respectively. The values 0, x and 1 are read across the edges of a node from left to right. The edges can either lead to another downstream node or can lead to a leaf. A leaf indicates the output of the function given its lead-in path from the top node. Each inverter 382 passed through along the path to a leaf functions to invert the leaf value. There are two terminal nodes (leaves): the 1 and x leaves, 380a and 380b, respectively in FIG. 7B. The leaf 380c represents a 0 output because of the inversion at 382. Methods have been devised for binary decision diagrams to indirectly represent the "don't care" (x) value and even generalized to represent integer functions by Shin-ichi Minato and R. E. Bryant and Y. Chen, "Verification of Arithmetic Circuits with Binary Moment Diagrams," Design Automation Conference, 1995. However, the automatic generator 230 of the present invention effectively represents x values directly using ternary decision diagrams.

In combinational OTDDs in accordance with the present invention, the x-edge 378b aids in representing table entries with at least one input that has the value "x." For Boolean logic gates and some logic simulators, "x" represents a value that may be 0 or 1, but is unknown. As such, an x-edge would be redundant in a diagram. However, for some table models, the x-edge represents a value different than an unknown between 0 or 1 and the OTDD accurately reflects this to perform rules checking and correct model extraction. Correspondingly, a combinational OTDD in accordance with the present invention has three leaf values: 0, 1 and x. For example, consider the functions:

$$f1 = a* !c + b*c \quad (1)$$

and $$f2 = a* !c + b*c + a*b \quad (2)$$

where "*," "+" and "!" represent Boolean AND, OR and NEGATION functions, respectively. The binary decision diagrams for the two functions are identical, but the ternary decision diagrams and ternary table representations differ. If "a," "b" and "c" are 1, 1 and x respectively, f1=x but f2=1.

In sequential OTDD graphs, the x-edges of data variables have the same semantic as in a combinational OTDD graph; but for clock inputs the x-edges represent a "possibly on" clock. During various stages of the automatic generator 230, sequential OTDD graphs can also have additional terminal nodes such as an "offstate," where all clocks are off or gated off.

Using inverted edges is a common method of reducing the size of OBDDs. Inverted edges can also reduce the size of OTDDs when applied as follows. First, the 0-leaf is replaced with the 1-leaf and all incoming edges are inverted. Second, the x-edge 378b of a node 376 cannot be inverted, instead, all other outgoing and incoming edges are inverted. Third, edges to the x-leaf 380b are not inverted, as an inverted x is still an x. Lastly, if the x-edge 378b of a node points to the x-leaf 380b, then the 0-edge of the node cannot be inverted, instead, the 1-edge and all incoming edges are inverted.

It is appreciated that OTDD graphs built at steps 310–315 of FIG. 5 according to the above rules are canonical, e.g., unique for a given input ordering. This is an important property of OTDDs which is exploited in the automatic generator 230 of the present invention. Step 310 of FIG. 5 therefore utilizes the rules given above with respect to an OTDD of the present invention to transform the current UDP into a complete combinational OTDD graph. The OTDD graph is represented as a data structure stored in computer memory. It is appreciated that given the above rules for an OTDD of the present invention, one or more well known methods could be used to realize step 310.

Figure 7A:
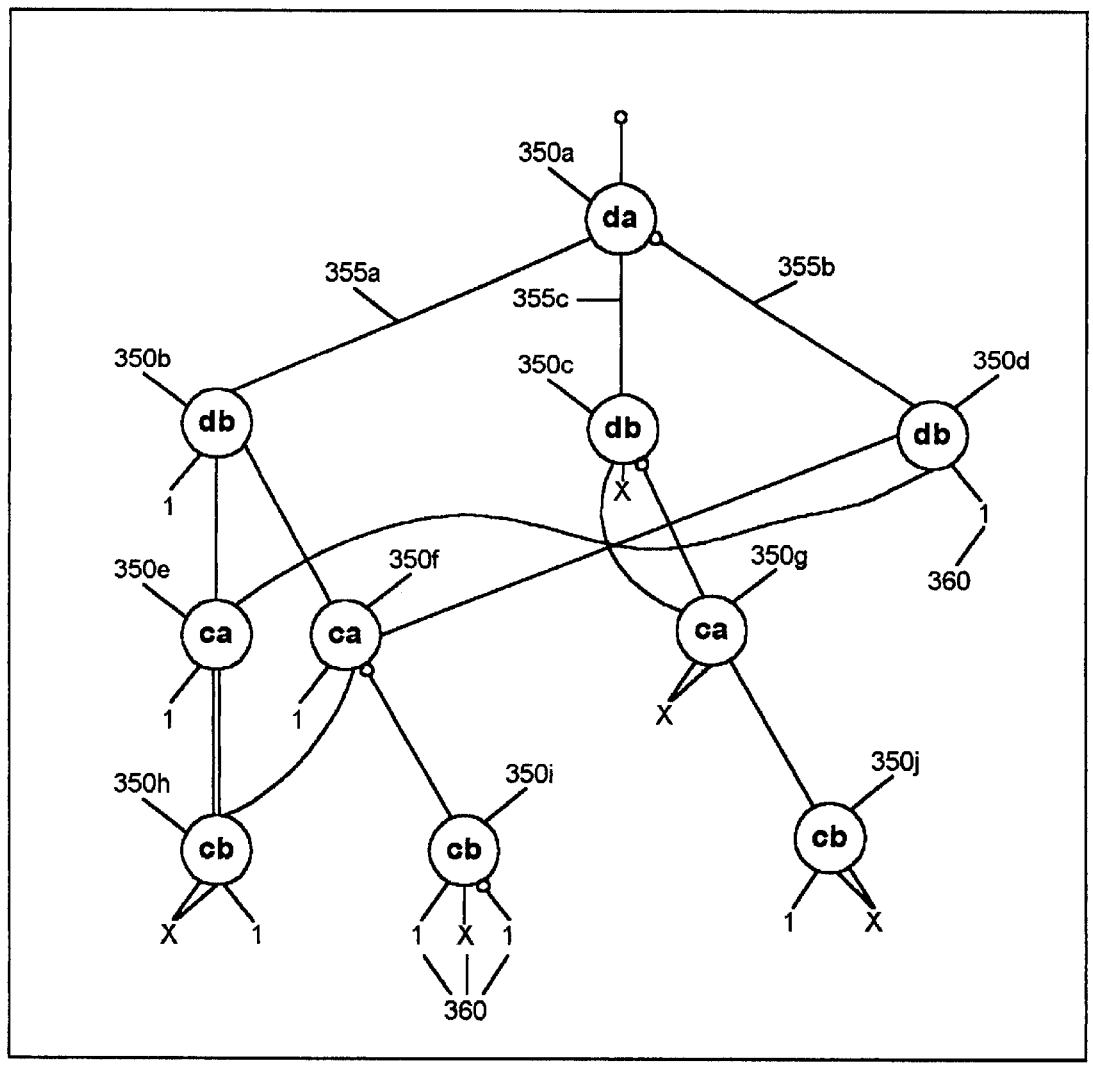
FIG. 7A is a graph representation of a first combinational ordered ternary decision diagram (OTDD) of the exemplary table-based description of FIG. 6 generated in accordance with the present invention.
Figure 7B:
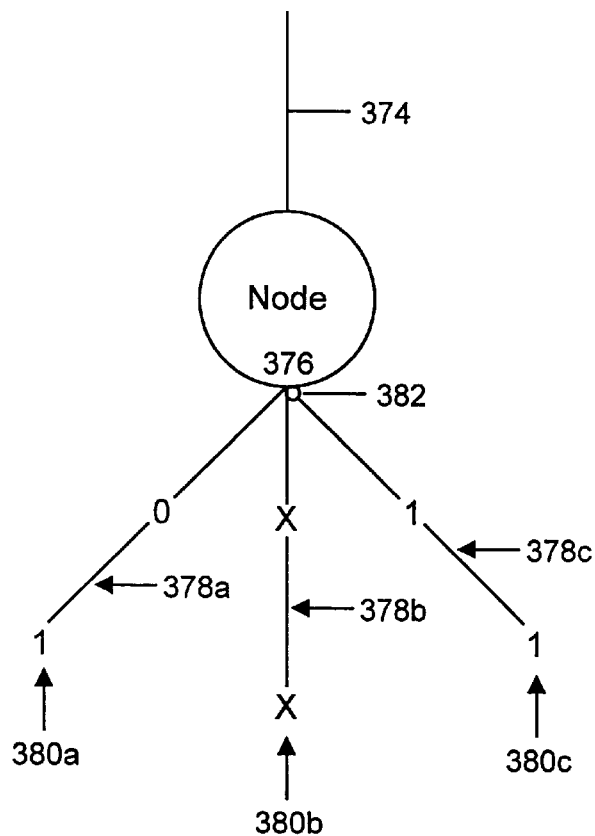
FIG. 7B is a generic OTDD node used in the combinational OTDD graph of FIG. 7A in accordance with the present invention.

FIG. 7A illustrates an exemplary complete combinational OTDD graph 350 generated by step 310 of FIG. 5 based on the current UDP 212a. Each node 350a–350j of FIG. 7A represents an input and the node's three outgoing edges correspond to the input's value being 0, x and 1, respectively (from left to right). Edges are directed from a source node downward to a sink node. Inverted edges are marked by small circles near the source nodes of the edges. FIG. 7A shows multiple 1 and X leaves only for clarity; the data structure used has only one 1-node and one X-node. OTDD graph 350 is traversed from top to bottom and contains four levels of nodes with input "da" being on the first level with node 350a, input "db" being on the second level with nodes 350b–350d, input "ca" being on the third level with nodes 350e–350g and input "cb" being on the fourth level with nodes 350h–350j. Exemplary leaves 360 are indicated and represent the function's output value based on a given path through graph 350.

For instance, assume a path from node 350a left (da=0) to node 350b, then right (db=1) to node 350f, then right (ca=1) to node 350i, then left (e.g., cb=0) to a leaf having a value "1." The path described above also traversed two inversions (one on top) so the output value is "1." Assume a path from node 350a left (da=0) to node 350b, then right (db=1) to node 350f, then right (ca=1) to node 350i, then right (e.g., cb=1) to a leaf having a value "1." The path described above also traverses three inversions so the output value is "0." Assume a path from node 350a center (da=x) to node 350c, then right (db=1) to node 350g, then right (ca=1) to node 350j, then left (e.g., cb=0) to a leaf having a value "1." The path described above also traverses two inversions so the output value is "1."

At step 315 of FIG. 5, the inputs of the first complete combinational OTDD graph 350 are reordered in accordance with the present invention. Input reordering is used to minimize the gate-level model 232 generated by step 320 and to efficiently recognize high-level gates (such as MUX and XOR). The goal of the input reordering process of step 315 is to place those inputs that have a greater contribution to the output value of the function closer to the top levels of a revised combinational OTDD graph. An example of the output of step 315 is shown in FIG. 9. FIG. 9 illustrates a revised complete combinational OTDD graph 440 with reordered inputs having nodes 440a–440h. In revised complete combinational OTDD graph 440 the inputs are ordered ca, cb, db and da rather than their original ordering of da, db, ca and cb (FIG. 7A). As shown, the revised complete combinational OTDD graph 440 is less complex compared to the first complete combinational graph 350 of FIG. 7A. Step 315 is described in more detail with respect to FIG. 8.

At step 320 of FIG. 5, the present invention then extracts a prime, non-redundant minimal gate network (e.g., gate-level description 232) from the revised ("input reordered") complete combinational OTDD graph 440 generated by step 315. As a general rule, each node of the OTDD graph 440 is translated into a gate or an input to a gate for the gate-level description. Design rule checking results 250e are also generated at step 320. In generating the gate-level description, the present invention at step 320 generates cube sets which are also known as "sum of products" with a cube being a product. The ANDed results of each path from the top node 440a to a leaf value of FIG. 9 are each cubes. The cubes are then ORed together to form a cube set. At step 320, the current combinational table 212a is extracted into a feedback-free, prime, network of Boolean gates. The resultant gate-level description 232 is a feedback-free non-redundant gate-level network. Step 320 is described in more detail with respect to FIG. 10. Step 260 then returns.

Input Reordering Step 315. Input reordering step 315 of FIG. 5 is now described in more detail with respect to FIG. 8. Ternary decision diagrams give canonical forms of ternary functions provided that the order of input variables is fixed, but the form and size of the OTDD graph can vary greatly with the permutation of inputs. The effect of input ordering varies with the kind of function represented. There are very sensitive functions (such as n-bit data selectors or multiplexers) with OTDD sizes that vary from linear in the number of inputs to exponential in the number of inputs by only reversing the order of the inputs. As a general rule, to keep the size of the OTDD graph to a minimum, inputs that have a greater contribution on the result are ordered such that they occur first in the diagram and also inputs with local computability are grouped together.

The increased memory requirement of larger OTDD graphs is not a major concern for the automatic generator 230 because, in one embodiment, UDPs represent only very small functions with few inputs and, after each UDP is processed, the memory used is freed. However, large data structures also take longer to manipulate and the processor time required to process hundreds of tables can increase significantly, especially for sequential models that require many more internal data-structure manipulations.

Combinational UDPs do not require as many data-structure manipulations as sequential UDPs, but input ordering is important for extracting a minimal Boolean function based on higher-level primitives. For example, identifying XOR or XNOR functions in an OTDD graph is an uncomplicated pattern match if the XORed or XNORed variables are adjacent, but the match becomes very difficult if they are not. A more complex example is identifying a multiplexer (MUX) function; not only should the variables be adjacent, but the ordering is important because the inputs of a MUX are not interchangeable.

Figure 8:
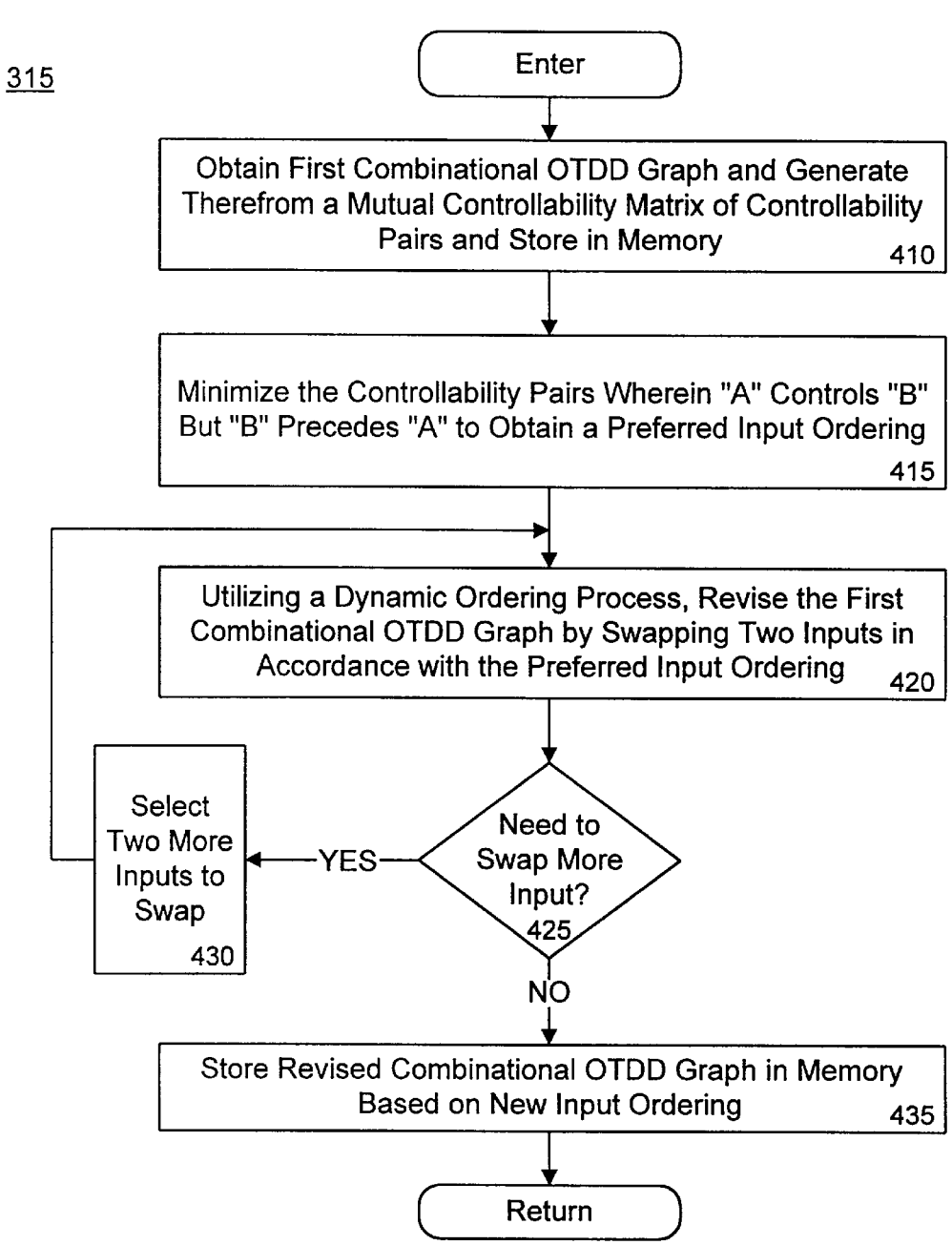
FIG. 8 is a flow diagram of steps of the input reordering process of FIG. 5 in accordance with the present invention.
Figure 9:
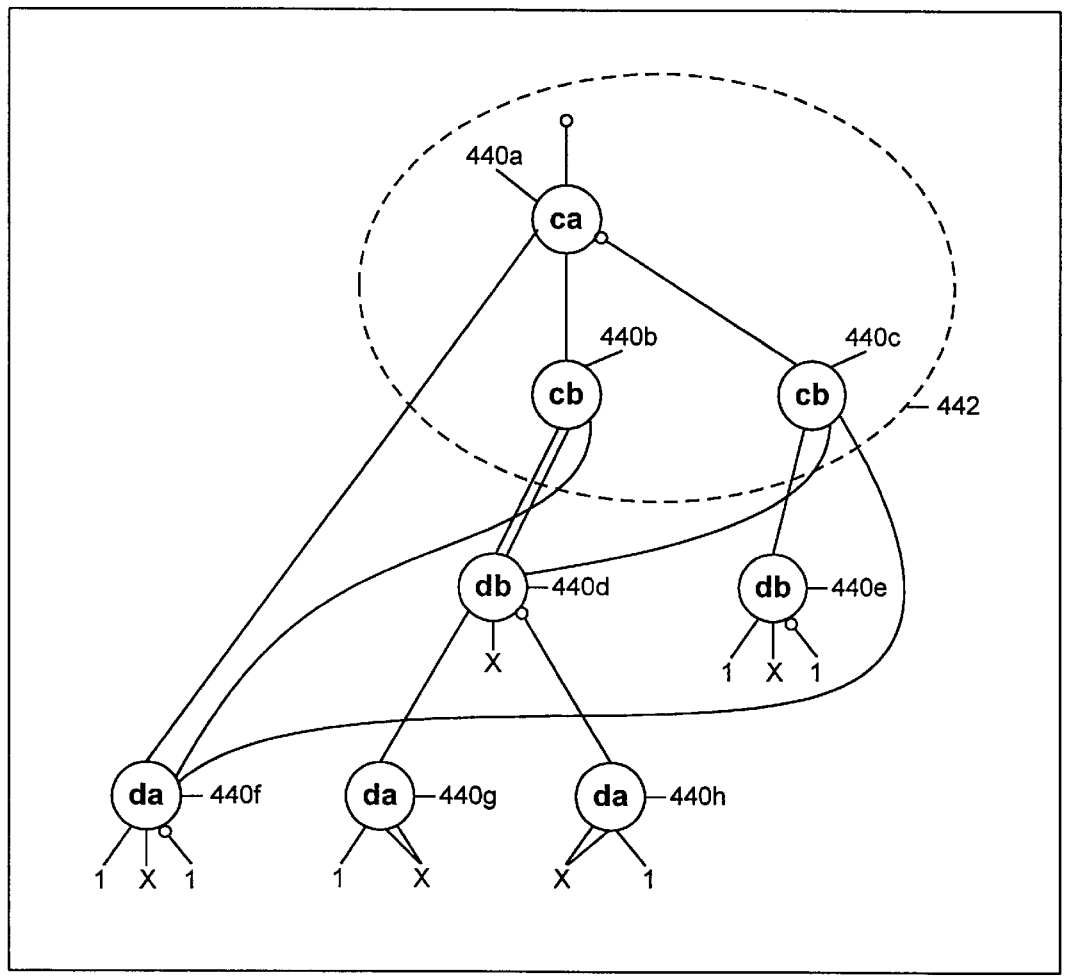
FIG. 9 is a graph representation of a revised combinational OTDD of the exemplary table-based description of FIG. 6 having inputs reordered in accordance with the present invention.

Processes 315 of FIG. 8 commences at step 410 where the first complete combinational OTDD graph 350 (7A) is obtained. Step 410 then generates therefrom a mutual controllability matrix having a number of controllability pairs for all pairs of inputs (a, b). Input "a" is said to control input "b" if input "a" fixed at a Boolean value results in an output value that is independent of the "b" value. For the UDP 212a in FIG. 6, the control relations generated at step 410 are:

mutual controllability matrix
input ca=0 controls input db;
input ca=0 controls input cb;
input cb=1 controls input db;
input cb=1 controls input ca.

For instance, input ca=0 controls input db because when input ca=0, the output value of the function does not depend on input db.

Next, at step 415 of FIG. 8, a preferred input ordering is determined in an effort to minimize the number of pairs (a, b) where input "a" controls input "b," as indicated from the mutual controllability matrix, but input "b" precedes input "a" in the final ordering of the revised complete combinational OTDD graph. Also, within the preferred input ordering, inputs that control each other are locally grouped together. While no polynomial-time process is guaranteed to always produce the optimal input order, the described heuristic works well in most practical cases. At step 420, the original input ordering and the preferred input ordering of step 415 are compared and a pair of inputs is selected for swapping in an effort to reach the preferred ordering.

At step 420, a dynamic ordering process is used to revise the first complete combinational OTDD graph 350 by swapping the selected input pair in accordance with the preferred ordering. Step 420 is a well known process and can be performed in accordance with a paper by R. Rudell, entitled "Dynamic variable ordering for ordered binary decision diagrams," International Conference on Computer-Aided Design, November 1993. At step 425, the present invention checks if more inputs need to be swapped to meet the preferred ordering defined in step 415. If so, then step 430 is entered to select a new input pair for swapping and step 420 is entered again. At step 425, if the preferred input ordering has already been reached, then step 435 is entered.

At step 435, the latest revised complete combinational OTDD graph generated by step 420 is stored in memory. An exemplary revised or "reordered" complete combinational OTDD graph 440 is shown in FIG. 9 and is a result of process 315 of FIG. 8 reordering the first complete combinational OTDD graph 350 of FIG. 7A. The reduction in OTDD graph size is not as significant in such a small example, however, high level function (e.g., MUX) recognition is much easier to perform on the reordered complete combinational OTDD graph 440 (FIG. 9) than on the first complete combinational OTDD graph 350 (FIG. 7A).

Gate-Level Description Generation Step 320. Gate-level description generation step 320 of FIG. 5 is now described in more detail with respect to FIG. 10. The problem of extracting compact cube sets is divided into two parts, by the present invention, and these parts are applied recursively for every OTDD node of the OTDD graph 440 (FIG. 9) to: (1) recognize high-level functions (such as XOR, XNOR, MUX); and (2) extract prime, non-redundant cube sets.

High level function replacement is performed at step 450. At step 450, the nodes of the revised complete combinational OTDD graph 440 (FIG. 9) are examined from the top node 440a downward to determine if any recognized high level functions (e.g., XOR, XNOR, MUX, etc.) can be found within the OTDD graph 440. A pattern recognition process can be applied at step 450 to perform high level function replacement. High level functions are recognized in step 450 based on predetermined patterns of nodes and connections between nodes within the OTDD graph 440. Node grouping can be performed in the pattern recognition process of step 450. For instance, assuming nodes 440a–440c were replaced by a single node 442 (having three computed new edges), then the pattern formed between replacement node 442 and nodes 440d–440h are recognized by step 450 as being a multiplexer (MUX) high level function with select lines controlled by input ca and cb. Extracting complex gates such as XOR, XNOR and MUX reduces the size of the gate-level model and eliminates many reconvergent fanout paths. It is appreciated that input reordering (step 315) aids in this process of high level function replacement.

Figure 10:
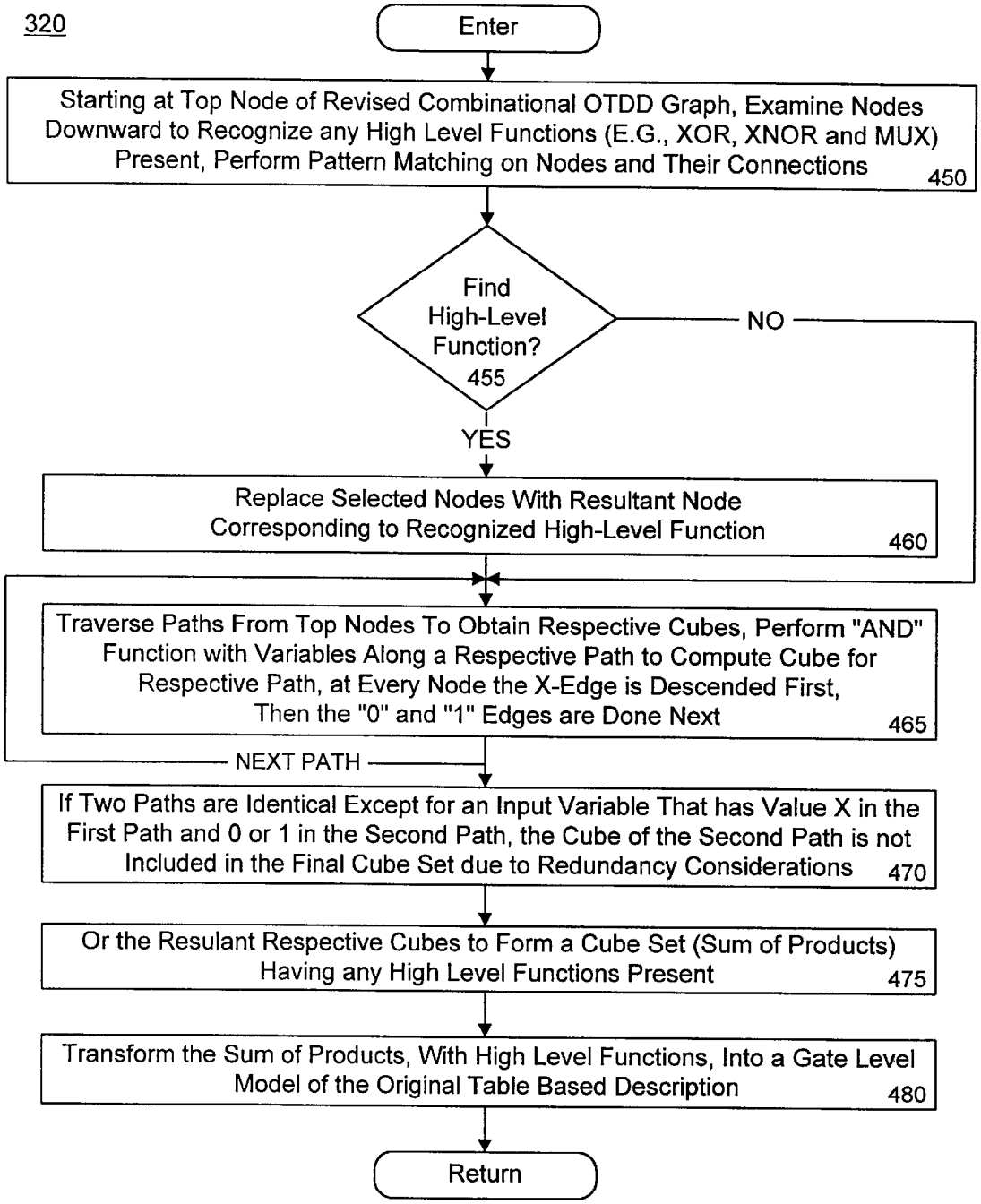
FIG. 10 is a flow diagram of steps of the gate-level network extraction process of FIG. 5 in accordance with the present invention.

Step 450 of FIG. 10 is applied recursively at every node of the reordered complete combinational OTDD graph 440. At step 455, if high level functions were recognized, then step 460 is entered, otherwise, step 465 is entered. At step 460, the present invention replaces certain nodes with the recognized high level function or functions from step 450. At step 465, cube sets are extracted from the OTDD graph 440 (as possibly modified by step 450). Respective paths within OTDD graph 440 are traversed from top to bottom to obtain a respective cube for each path. Cubes are ANDed functions of the input signals for a particular path leading to a particular leaf value (e.g., "1"). As shown, step 465 is performed for individual paths of the OTDD graph 440. At step 450 and step 470, the automatic generator 230 of the present invention exploits the additional information present through the x-edges to ensure prime non-redundant cubes. At step 450, at every node, the x-edge is descended first, followed by the "0" edge and followed by the "1" edge to compute the cubes.

At step 470 of FIG. 10, processes are performed to guarantee that the resultant cube set is prime and non-redundant. For instance, not all paths are enumerated. Specifically, at step 470, variables at x are not included in the cube because they cannot influence its value; this can be shown to ensure that cubes are prime. Further, if two paths are identical except for an input variable that has value x in the first path and 0 or 1 in the second, the cube of the second path is not included in the final cube set because it would be redundant. Steps 465 and 470 are based on, in part, a process described by S. B. Akers, in a paper entitled "Binary Decision Diagram," IEEE Transactions on Computers, Vol. C-27, No 6, pp. 509 Vol. C-27, No 6, pp. 509–516, June 1978. However, the method in Akers' paper deals with OBDDs and does not necessarily generate prime cubes. The process described in this paper is modified in accordance with the descriptions herein.

At step 475 of FIG. 10, the present invention then ORs the resultant cubes into a prime, non-redundant reduced cube set (also known as a sum of products function) having any high level functions present. At step 480, the present invention then transforms the prime, non redundant minimized cube set generated by step 475 (with high level functions) into a gate-level description 232. The process of transforming a sum of products (e.g., cube set) into a gate-level description is a well known process and any of a number of well known transformations can be applied at step 480.

Figures 11, 12:
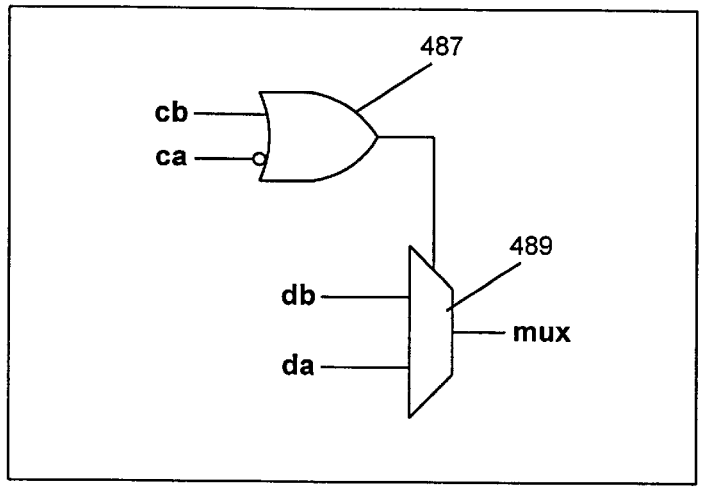
FIG. 11 is a gate-level description ("circuit") of the exemplary table-based description of FIG. 6 generated in accordance with the present invention.
FIG. 12 is a structural description of the gate-level description of FIG. 11 generated in accordance with the present invention.

An example gate-level representation 485 of the revised complete combinational OTDD graph 440 is shown in FIG. 11. The gate-level representation 485 includes an OR gate 487 that receives both cb and ca and generates a control signal to a multiplexer 489 which receives db and da as inputs. The select line of the MUX 489 has been inverted: !(ca*!cb)=cb+!ca; and the data inputs of the MUX 489 are switched so that select=0 selects input "db," not input "da." Logically, the function is exactly the same and shows an alternative implementation with the same number of gates. FIG. 12 illustrates the resulting combinational structural level description 490 of the gate-level representation 485 and is generated by step 275 of FIG. 4. The structural Verilog output in FIG. 12 uses the target test-generator's primitives $_{13}$ OR and $_{13}$ MUX. Unlike Verilog, the output is the last net in the argument list of these primitives. Note that Verilog has an OR primitive, but no MUX in its primitive set.

The extracted gate-level description produced by step 320 of FIG. 10 is optimized for test-generation, having the following properties. First, there are no combinational feedback paths. Feedback effects (if any) are represented by state primitives (latches and flip-flops). Second, there are no redundant gates or gate inputs because all extracted cubes are prime and non-redundant. Third, most reconvergent fanout paths are eliminated by using high-level gates (e.g., XOR, XNOR, MUX). Fourth, the number of gates is minimal or very close to minimal and all non-structural gates are eliminated.

Extracting complex gates such as XOR, XNOR and MUX (at step 450 of FIG. 10) reduces the size of the gate-level model and eliminates many reconvergent fanout paths. This provides for a minimal gate-level extraction. Each extracted cube (product) is prime; that is, no input variable can be eliminated without changing the function. Additionally, there are no redundant cubes, e.g., no cube can be eliminated without changing the function. All 1-paths through the OTDD graph 440 are enumerated, starting at the root. Each path forms a cube of all variables traversed and all cubes are ORed to form the final cube set.

Generally, the cube set extraction process of FIG. 10 works correctly if the x-edge part of the OTDD graph 440 is consistent with the interpretation of x as "don't care." In a network of Boolean gates, a value of "x" on an input propagates as an unknown between a value of 0 and 1. For example, if the output has value 0 if input A is 0 or if input A is 1 (all other inputs being at some fixed values), then the output value must also be 0 if input A is "x." The reverse implication is also true. If the current UDP 212 (table model) has a different interpretation of "x," rule violations will be raised and the gate-level model will reflect as much of the table's functionality as possible. If there is any difference between the current UDP and the gate-level description, the latter must be more "pessimistic," e.g., if the UDP's output is 0, the gate-level description's output could be "x," but not vice-versa. This avoids introducing errors in the downstream design flow.

Sequential UDP Processing

Figure 13:
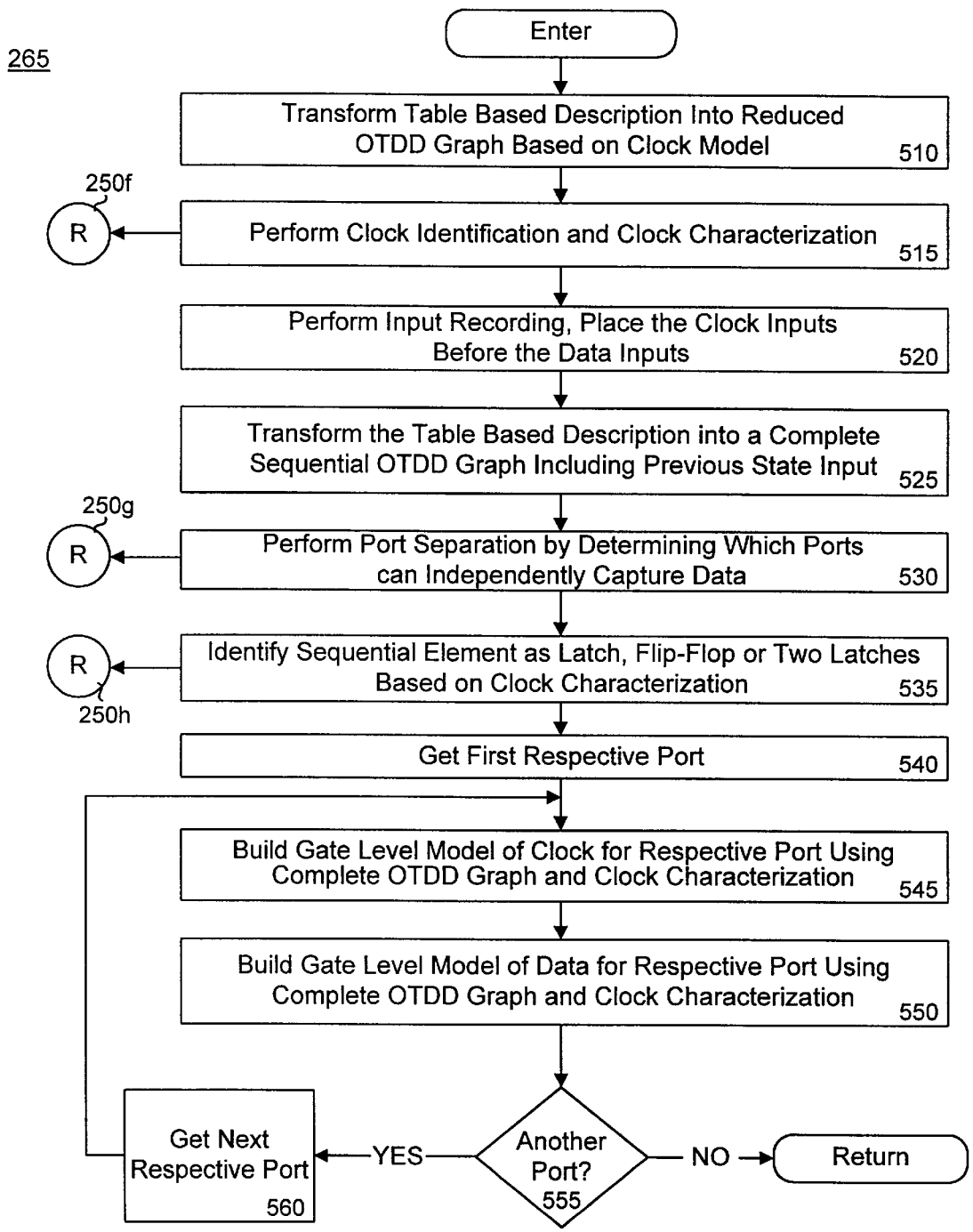
FIG. 13 is a high level flow diagram illustrating steps of the automatic process of the present invention applicable to transforming sequential table-based descriptions into gate-level descriptions.

As discussed above, when the parser 245 (FIG. 4) determines that the current UDP is a sequential circuit model, then step 265 is entered. Step 265 is now described in further detail with reference to the steps of FIG. 13. FIG. 13 is a flow diagram illustrating steps of the automatic process 230 of the present invention applicable to transforming sequential table-based descriptions into gate-level descriptions. At step 510, a current sequential UDP 212b is read and a reduced or "clock" sequential OTDD graph is generated. FIG. 14 shows an exemplary sequential UDP 212b which is the Verilog UDP of a latch with an active-low reset input "rb" and a clock "ck" ANDed with another input, "a." The output "q" is defined as reg (Verilog register), which shows to the parser 245 that a sequential model is to be extracted. The sequential UDP 212b contains a header section 570, and a table section 575 which defines the output of the sequential element for given combinations of input values. As before, the syntax "?" refers to an unknown or "don't care" state. The two dashes "-" 577 indicate states in which all clocks are off. The syntax "qt" represents the prior state of the sequential element.

At step 510, the current sequential UDP 212b is read and a reduced or "clock" sequential OTDD graph is generated. The clock OTDD graph utilizes a generic node that is different from the generic node of the complete combinational OTDD graph that is generated and revised in step 260.

An exemplary clock sequential OTDD graph 580 generated by step 510 is shown in FIG. 15 for the sequential UDP 212b of FIG. 14 and contains three nodes 580a–580c. The representation of nodes and edges and leaf values in the "clock OTDD graph" 580 is different from the complete combinational OTDD graphs (350 and 440) described above.

Figure 16:
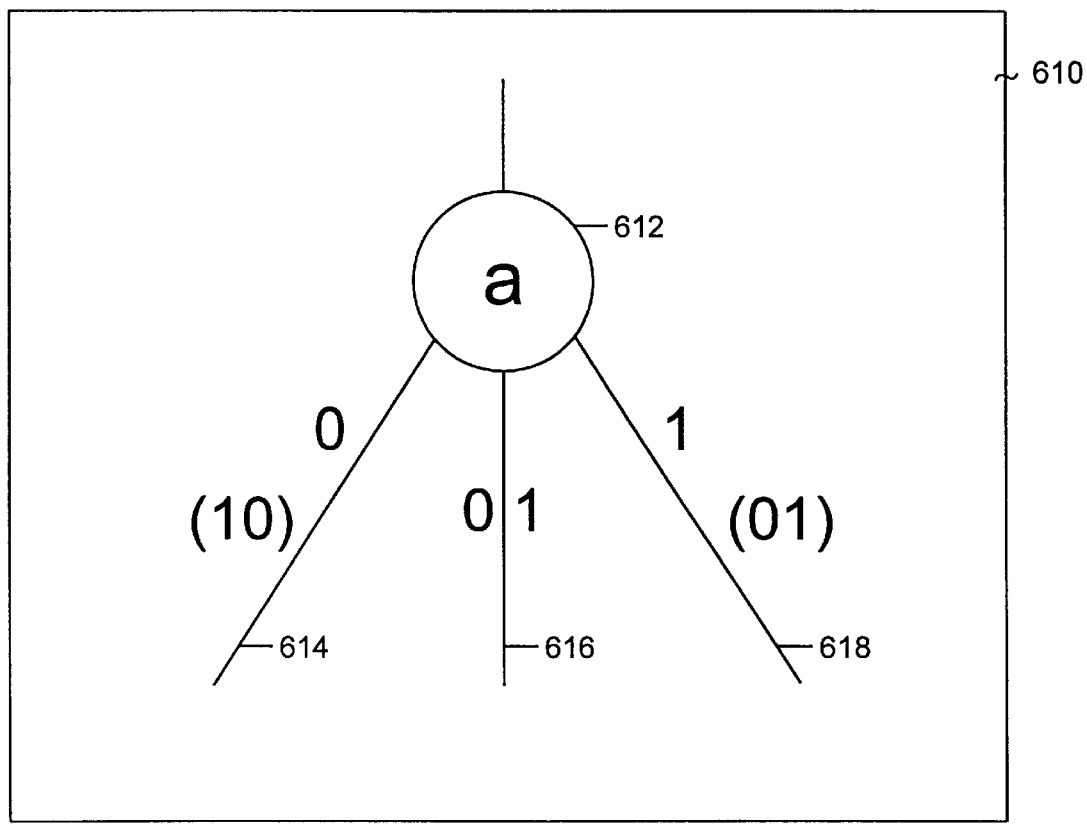
FIG. 16 is a generic OTDD node used in the "clock" OTDD graph of FIG. 15 in accordance with the present invention.

For instance, FIG. 16 illustrates a generic clock OTDD graph 610 with a generic node 612 in accordance with the present invention. Because the type (clock or data) and nature (level- or edge-sensitive clock) of the input variables is unknown when the clock OTDD is constructed, the three outgoing edges of each node 612 are assigned by the present invention as follows. The left edge 614 represents the input variable having a value 0 or (10), e.g., a falling edge of the signal. The middle edge 616 represents the value 0 or 1. The right edge 618 represents the value 1 or (01), e.g., a rising edge of the signal. Other input values are not represented in the clock OTDD graph 580 of the present invention. Also, a capture is allowed to override a keep state in the clock OTDD graph of the present invention. For example, for a positive edge-triggered clock, the level-sensitive value 1 (edge 616) results in an offstate (at least of this clock), whereas the (01) edge 618 results in the clock being on.

Leaf values are now described with respect to the clock OTDD graph 580 of the present invention. As illustrated in FIG. 15, the 0-leaf value (inverted 1-leaf 584) represents the all-clocks-offstate (offstate), and the 1-leaf (leaf 582) represents that at least one clock is on or possibly on. Therefore, data inputs do not appear in the clock OTDD graph 580 of the present invention because the value of data inputs cannot, by definition, affect reaching the 0- or 1-leaf on any path. Herein, when describing an OTDD graph constructed using the generic node 612 of FIG. 16 it is called a "clock OTDD."

At step 515, clock characterization and identification is performed and design rule checking results 250f are generated. The steps of process 515 are described in more detail with respect to FIG. 17. At step 620 of FIG. 17, the present invention determines which inputs of the sequential UDP 212b are clock inputs and which are data inputs. These terms are best explained in the context of the final gate-level description. Any input that has connectivity to the set, reset, or clock ports of a state element (latch or flip-flop) is a "clock" input and all other inputs are "data" inputs. Clock inputs can include clock signals and clock-gating signals that can be interchangeable.

For example, consider a level-sensitive model represented by a latch and combinational gates. Assume inputs "a" and "ck" are ANDed and the result connected to a clock port of the latch. In this configuration, input "a" can be a clock signal and "ck" a clock-gating signal, or "ck" a clock and "a" a clock-gating signal. The distinction is given entirely by the way in which the module is connected to other modules in a design and has no influence on the UDP, the OTDD graph, or the gate-level description of the module. By contrast, if the latch were replaced with a flip-flop, "ck" could have an edge-sensitive clock action while "a" has a level-sensitive gating effect. In this case, "ck" and "a" are no longer interchangeable. Therefore, the clock-identification process 515 also determines the level vs. edge sensitivity of each clock input and their "off" and "on" states.

Figure 17:
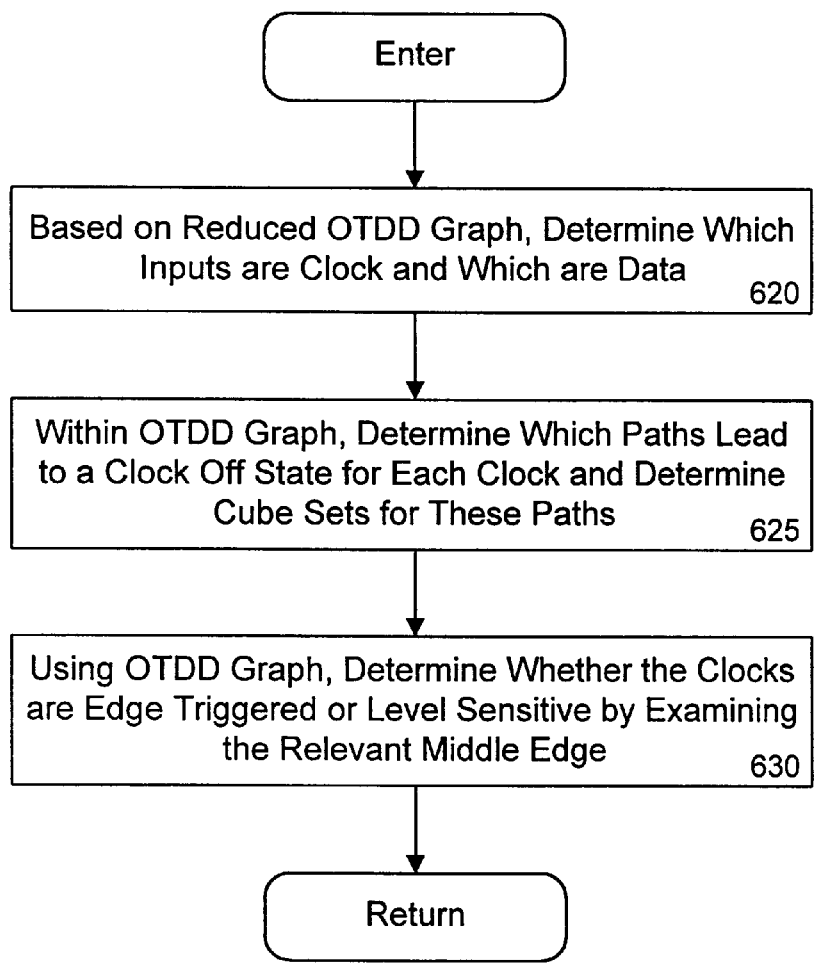
FIG. 17 is a flow diagram of steps of the clock identification and characterization process of FIG. 13 in accordance with the present invention.

At step 620 of FIG. 17, the present invention utilizes the clock OTDD graph 580 to determine those input signals that are clock signals and those input signals that are data signals. Those input signals that have corresponding nodes within the clock OTDD graph 580 are determined to be clock signals and those input signals that do not have a corresponding node within the OTDD graph 580 are determined to be data signals. Data inputs are identified as input variables whose values do not influence the on or offstate. Therefore, data inputs do not appear in the clock OTDD graph 580. For instance, with reference to FIG. 15, the present invention determines at step 620 that input signals "a," "ck" and "rb" are clock signals and that signal "d" is a data signal. Therefore, for sequential table models, a clock OTDD graph 580 is first created and used to classify the input signals as "clock" or "data". Additionally, the offstate of the individual clocks can also be determined from the clock OTDD graph 580 in FIG. 15.

At step 625 of FIG. 17, the present invention uses the clock OTDD graph 580 to determine which paths lead to a clock offstate for each clock and determines the cube sets for these paths. The OTDD graph 580 is shown in FIG. 15. The 0-leaf 584 in this decision diagram 580 represents the all-clocks-offstate (offstate), e.g., the state in which data inputs may change without affecting the output. Any other leaf of the diagram is a 1-leaf, representing at least one clock on or possibly on. To determine the offstates of the clock signals, step 625 utilizes the OTDD graph 580 and performs the following processing. From node 580a, only the left edge directly leads to an offstate 584. Therefore, clock input "a" has an offstate value of 0 (e.g., the left edge). From node 580c, only the left edge directly leads to an offstate 584. Therefore, clock input "ck" has an offstate value of 0 (e.g., the left edge). However, the offstate for node 580b is to the right edge. Therefore, clock input "rb" has an offstate value of 1. Thus, signal "rb" has offstate 1 and "a" and "ck" have offstate 0.

To determine the function for the offstate of a clock, step 625 determines the paths to the 0-leaf 584 (e.g., an inverted path to the 1-leaf). The offstate results are expressed in the sum of products. For instance, $$!a*rb+!ck*rb=rb*(!a+!ck)$$

It is appreciated that at step 625, the present invention utilizes the techniques described with respect to FIG. 10 to determine the prime, non-redundant cube sets that describe the offstates of the determined clock signals, one of which is given above.

At step 630 of FIG. 17, the present invention utilizes the clock OTDD graph 580 to determine if the clock signals are edge triggered or level sensitive. The x-edges of the clock OTDD graph 580 of the present invention contain level-information that is used to separate level-sensitive from edge-triggered clocks as follows. First, for level-sensitive clocks, the x-edge cannot be on a path to the offstate, because the clock will be on when the input has either value 0 or 1. Exactly one of the zero and one edges will be on a path to the offstate, the other one shows the active state of the clock. Second, for edge-triggered clocks, the x-edge can be on a path to the offstate, because it represents only level values. Exactly one of the zero and one edges will be on a path to the offstate, the other one shows the active state of the clock.

Using this above information, step 630 performs the following determination from exemplary OTDD graph 580 of the present invention. Node 580b if FIG. 15 is examined. The middle edge leads to an on state, not to the offstate. Therefore, clock signal "rb" is level sensitive. If clock signal "rb" was edge triggered, then the middle edge of node 580b would lead to an offstate. Second, node 580c is examined. The middle edge leads to an on state, not to the offstate.

Therefore, clock signal "ck" is level sensitive. If clock signal "ck" was edge triggered, then the middle edge of node 580c would lead to an offstate. Lastly, node 580a is examined. The direct path from node 580a to the offstate does not go through the middle edge of node 580a. Therefore, clock signal "a" is level sensitive. If signal "a" was edge triggered, then the middle edge of node 580a lead directly to an offstate.

In sum, the clock identification of characterization process 515 of FIG. 17 uses the clock OTDD graph 580 of FIG. 15 to determine: (1) which input signals are data and which are clocks; (2) the offstates of the clocks; and (3) whether the clocks are edge triggered or level sensitive.

After step 515 of FIG. 13, step 520 is next entered which performs input reordering. At step 520, the present invention reorders the inputs of the sequential UDP 212b by placing the clock inputs before the data inputs. With respect to the exemplary UDP 212b, clock inputs "a," "ck," and "rb" are placed before data signal "d." Input reordering minimizes the size of the next generated OTDD graph and simplifies the following steps. A significant size reduction of the next OTDD graph (e.g. step 525) can be achieved by moving all clock inputs before all data inputs. This ordering is used to build the complete sequential OTDD graph which is described below. Further processing of the complete sequential OTDD graph uses a second input re-ordering method common with complete combinational OTDD graphs.

Figure 20A:
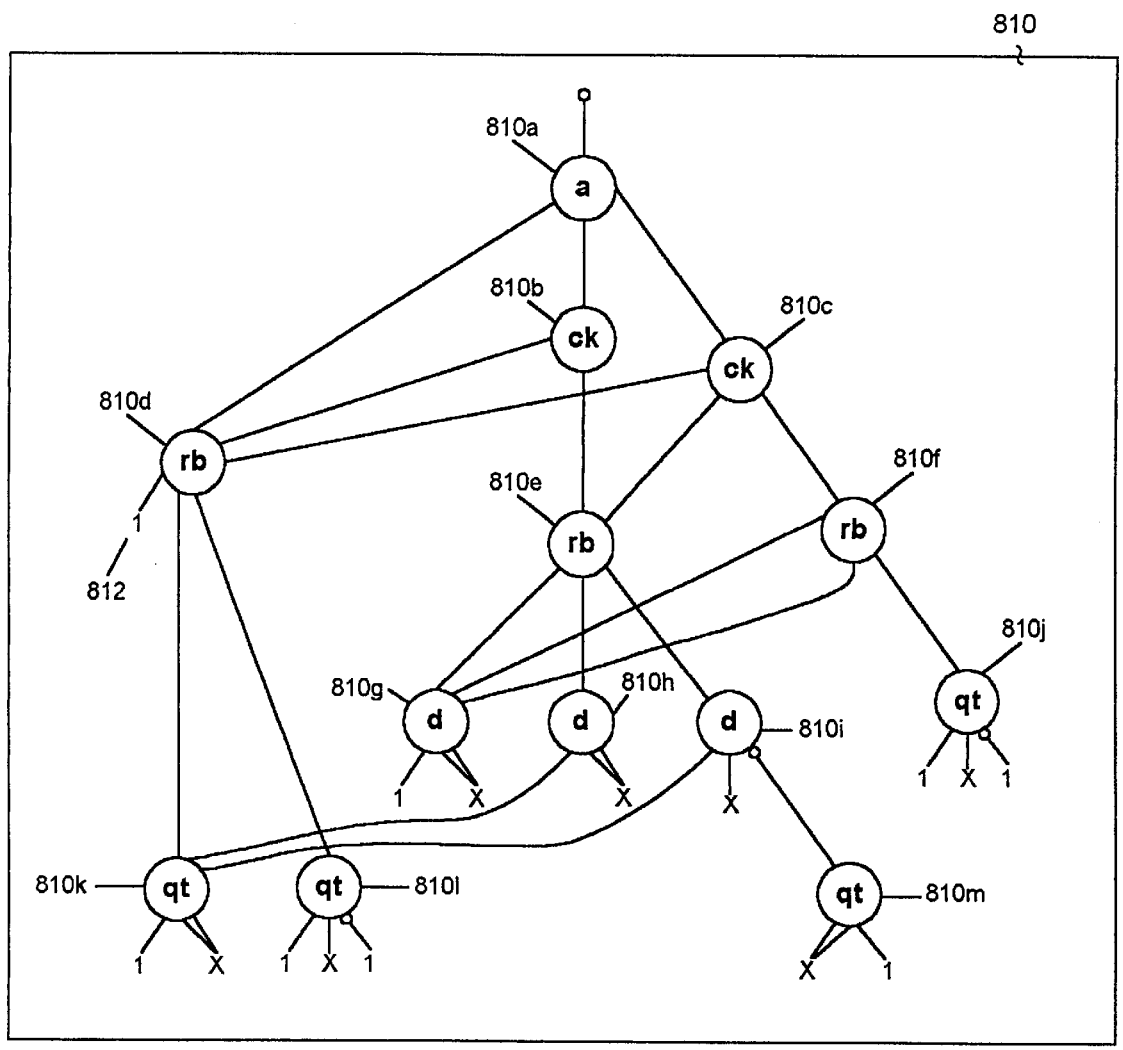
FIG. 20A illustrates a complete sequential OTDD for the sequential table-based description of FIG. 14 generated in accordance with the present invention.

Step 525 of FIG. 13 then transforms the sequential table-based description 212b into a complete sequential OTDD graph using a process analogous to the process described with respect to step 310 and step 315. An exemplary complete sequential OTDD graph 810 for the exemplary UDP 212b is shown in FIG. 20A. As shown in FIG. 20A, the inputs are ordered such that clock inputs precede the data inputs. The clock inputs "a," "ck" and "rb" have been brought before the data input "d" to minimize the size of the complete sequential OTDD 810 and simplify subsequent steps. Also at step 525, the present invention adds the "qt" input (e.g., nodes 810k–810m) into the complete sequential OTDD graph 810. The last input in the complete sequential OTDD graph 810 is input "qt," the previous state of the UDP 212b. The signal "qt" is akin to a data input and allows identification of output-to-input feedback paths present in some edge-triggered sequential models. The "qt" input is processed much like any other input and its value is generated during circuit simulation.

Step 530 of FIG. 13 then performs port separation of the clock signals by determining the signals of the current sequential UDP 212b that correspond to a same port. In the current example, there are three clock signals, so there could be one, two or three ports. The port-separation rules of the present invention used at step 530 are the following. Each port has to be able to independently capture data, e.g., independently from the other ports. Likewise, if two or more signals are not able to capture data independently, then they share a same port. At step 530, clock inputs are separated by the ports to which they will be connected. Some inputs may be connected to multiple ports, others to just one.

At step 530, the offstates of the clocks are known from step 515. This information is used by the present invention to perform port separation. The input "a" has an offstate of zero (a=0). Traversing the complete sequential OTDD graph 810 of FIG. 20A from node 810a to the left (a=0), node 810d is reached and the "ck" input is bypassed. Therefore, the "ck" input and the "a" input are not independent. However, the "rb" input belongs to a separate port because when rb=0, a "1" is output. In effect, "rb" can capture data even though inputs "a" and "ck" are in their offstates. Also, inputs "a" and "ck" can capture data even though input "rb" is in its offstate (rb=1). However, input "a" is not able to capture data when input "ck" is in its offstate and vice-versa. As a result of the above processing, input "rb" is placed with port-one and inputs "ck" and "a" are placed with port-two. Step 530 also generates certain design rule checking results 250g.

Step 535 of FIG. 13 then identifies the sequential element as being a latch, a flip-flop or a pair of latches. Generally, a single-bit output usually requires a single latch or flip-flop although, in some cases, more than one state element is required. For example, a mixture of level-sensitive and edge-sensitive ports can be modeled with two latches. More specifically, if all of the identified clocks of the sequential UDP 212b are level sensitive, as in this example with UDP 212b, then the sequential element is identified as a latch. However, if one or more of the identified clocks are edge sensitive, then the sequential element is identified as a flip-flop or composed of two or more latches. Step 535 also generates certain design rule checking results 250h.

In the following steps of FIG. 13, the present invention next determines the functions at each port. The present invention generates the full OTDD graph for each identified port of the sequential element and the gate-level description is then generated based on the full OTDD graph for each port with the sequential element. In the example given above, two ports were identified, port-one and port two. At step 540, a respective port is selected, e.g., port-one. It is appreciated that each port is divided into (1) a clock portion and (2) a data portion within the present invention. Steps 545 and 550 build the gate-level circuits for the clock portion and the data portion, respectively, for each port of the sequential element. To built the gate-level circuits for each port, individual OTDDs are constructed for the clock and data portions of each port and each individual OTDD is passed through input reordering and prime non-redundant gate-level extraction as described above.

Figure 18:
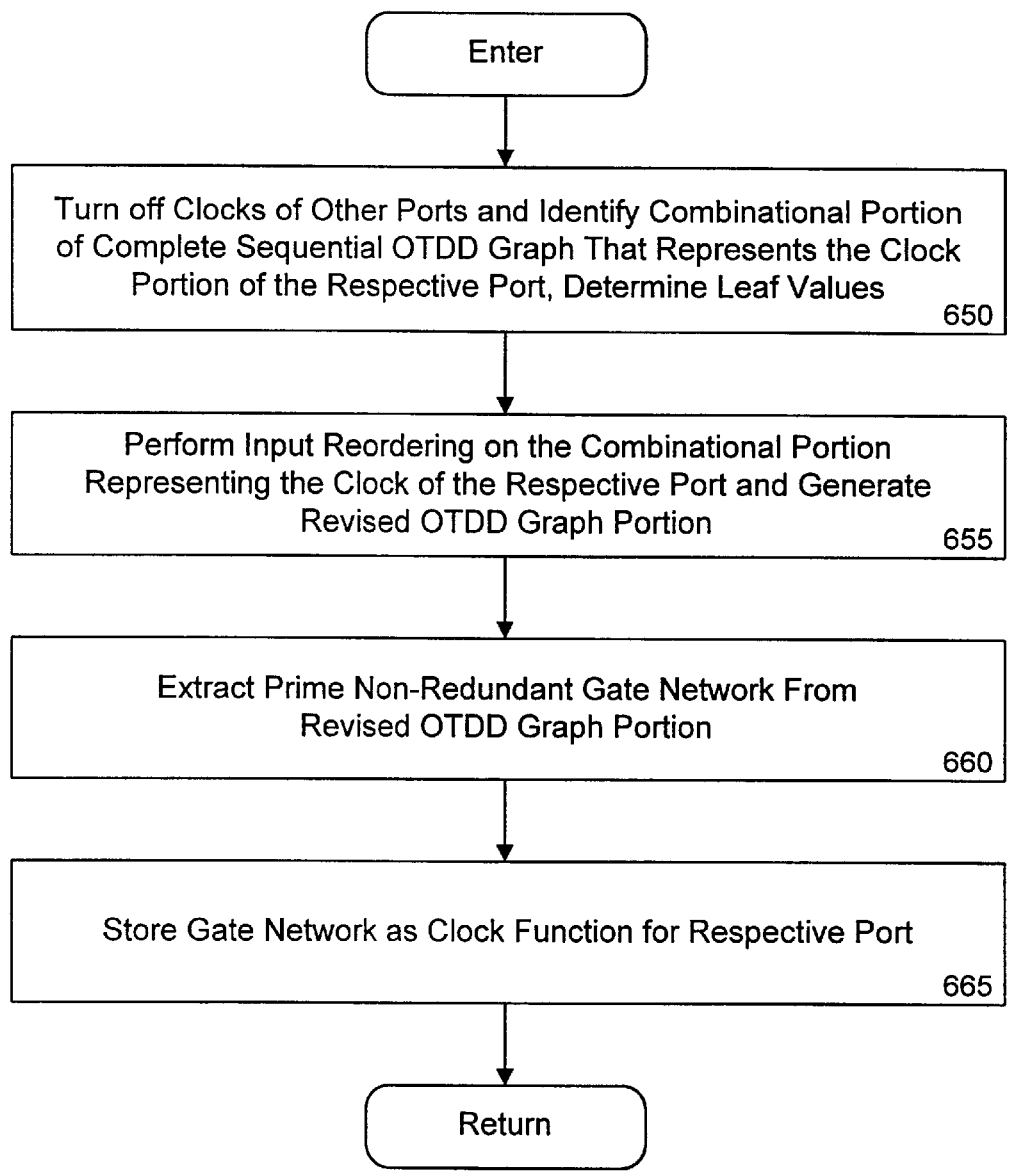
FIG. 18 is a flow diagram of steps of the "clock-portion" gate-level construction process of FIG. 13 for a respective port in accordance with the present invention.
Figure 20B:
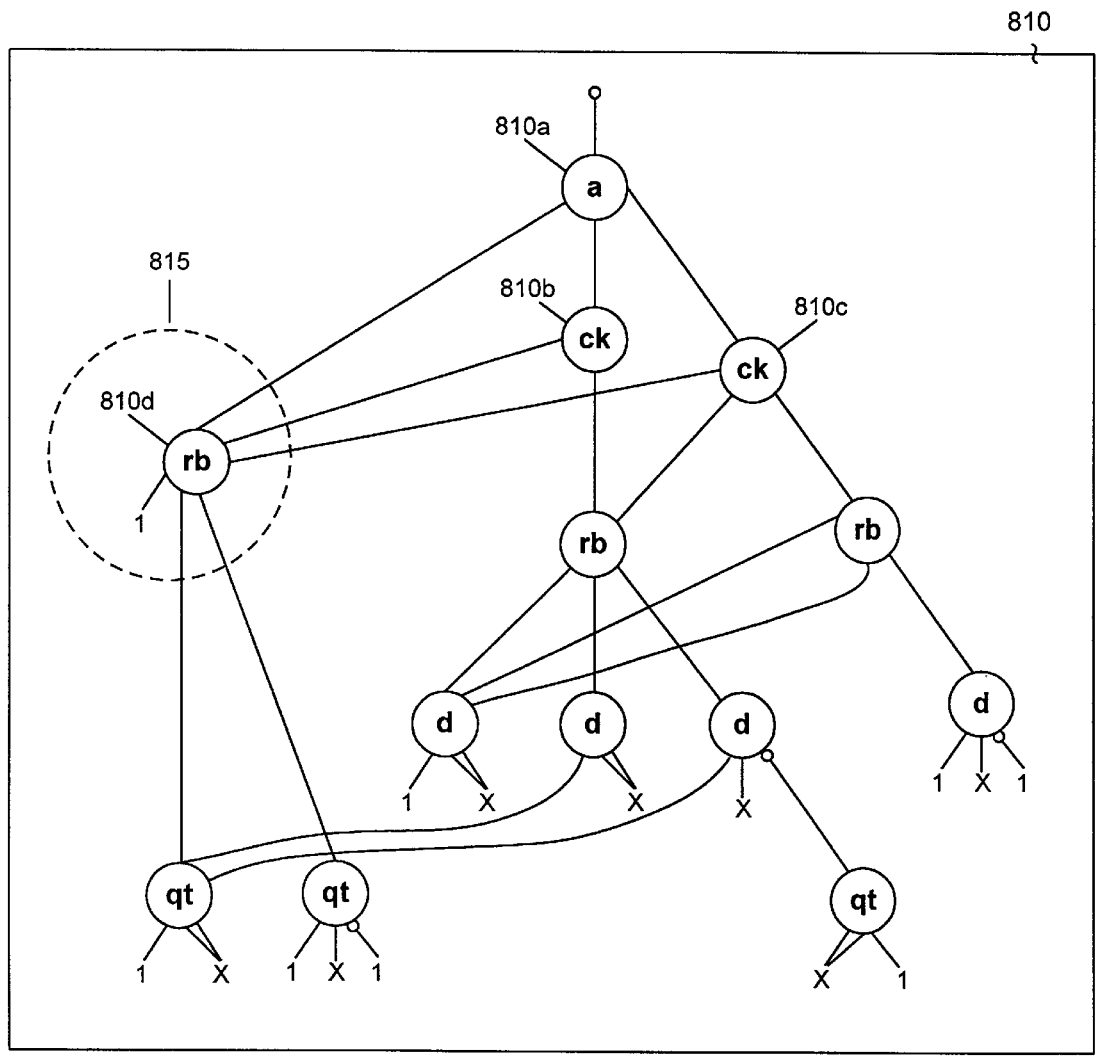
FIG. 20B illustrates the OTDD graph portion identified by the present invention for the "clock-portion" of a first exemplary port of the table-based description of FIG. 14.

For instance, at step 545 of FIG. 13, the present invention builds the gate-level model of the clock portion of the respective port using the complete OTDD graph 810 of FIG. 20A, clock characterization information obtained from step 515 and the identity of the sequential element obtained from step 535. FIG. 18 is a flow diagram of steps of the "clock-portion" gate-level construction process of FIG. 13 for a respective port in accordance with the present invention. At step 650 of FIG. 18, the present invention turns off the clocks of the other ports that are not the respective port and identifies the combinational portion of the complete sequential OTDD graph 810 that represents the clock portion of the respective port. Using port-one as an example, clocks "a" and "ck" are turned off based on their predetermined offstates, e.g., ck=a=0. Traversing OTDD graph 810 from node 810a, the left edge of node 810a is followed (a=0) to node 810d, also the left edges of node 810b and node 810c (ck=0) both led to node 810d. FIG. 20B illustrates that combinational portion 815 of OTDD graph 810 represents this function for the clock portion of port-one. Graph portion 815 has the following node leaf values computed: left edge leaf is "1," middle edge leaf is "x" and the right edge leaf is "0" because when qt=0 the value is 0 and when qt=1 the value is 1. Graph portion 815, with computed leaf values, can now be treated as a separate OTDD.

At step 655 of FIG. 18, input reordering is performed with respect to the combinational OTDD portion 815 (with computed leaf values). At step 655, the same input reordering process as described with respect to step 315 of FIG. 8 is performed on the combinational OTDD portion 815. At step 660 of FIG. 18, the present invention then extracts the prime non-redundant gate-level network of the combinational OTDD portion 815 (with computed leaf values). Step 660 is performed on the combinational OTDD portion 815 using the same gate-level extraction process described with respect to process 320 of FIG. 10 and cube sets are computed as an intermediate step. At step 665, the present invention stores the determined gate-level network as the clock function of the respective port (e.g., port-one). In this example, the extracted gate-level network is merely an inverter.

Figure 19:
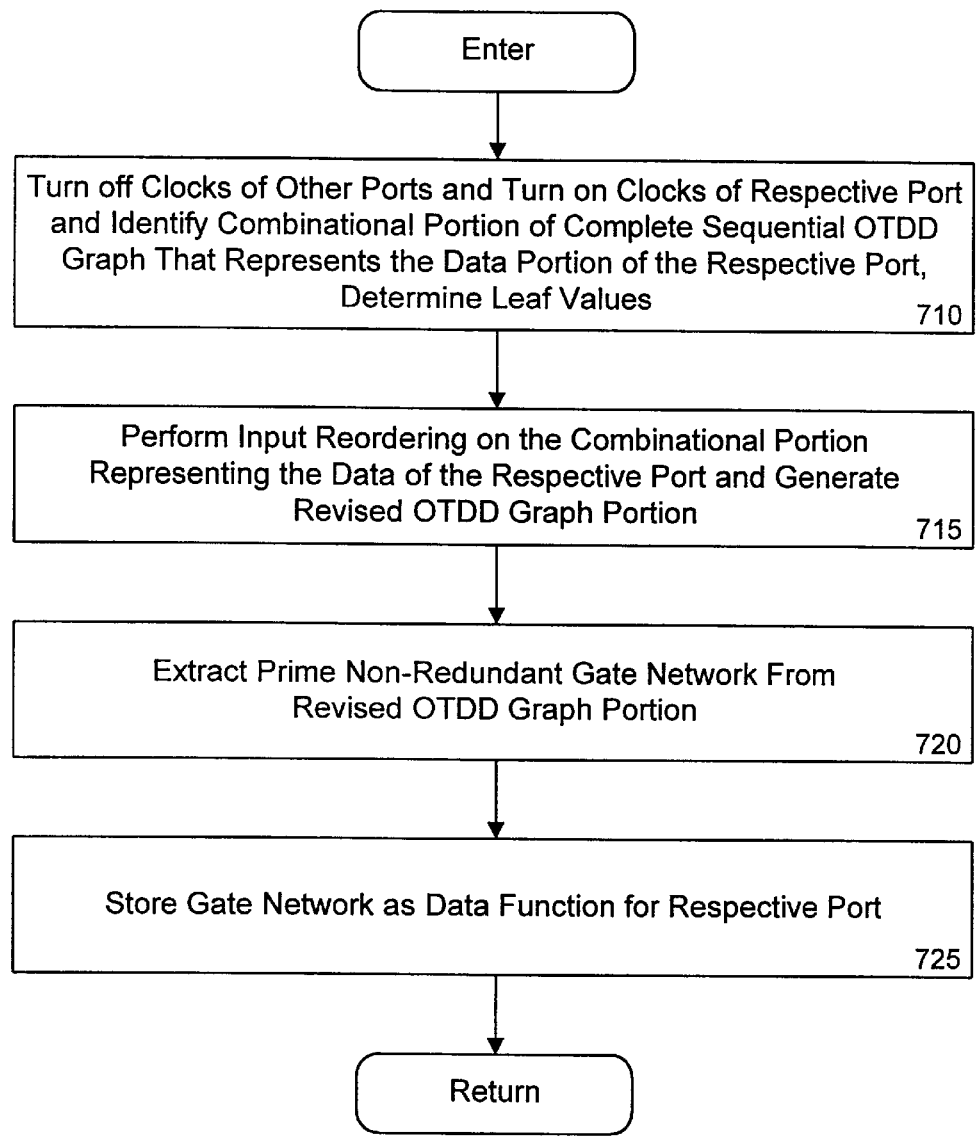
FIG. 19 is a flow diagram of steps of the "data-portion" gate-level construction process of FIG. 13 for a respective port in accordance with the present invention.

At step 550 of FIG. 13, the present invention then builds the gate-level model of the data portion of the respective port (e.g. part one) using the complete OTDD graph 810, clock characterization information obtained from step 515 and the identity of the sequential element obtained from step 535. FIG. 19 is a flow diagram of steps of the "data-portion" gate-level construction process 550 of FIG. 13 for a respective port in accordance with the present invention. At step 710 of FIG. 19, the present invention turns off the clocks of the other ports that are not the respective port and turns on the clock of the respective port. Then, the present invention identifies the combinational OTDD portion of the complete sequential OTDD graph 810 that represents the data portion of the respective port.

Figure 20C:
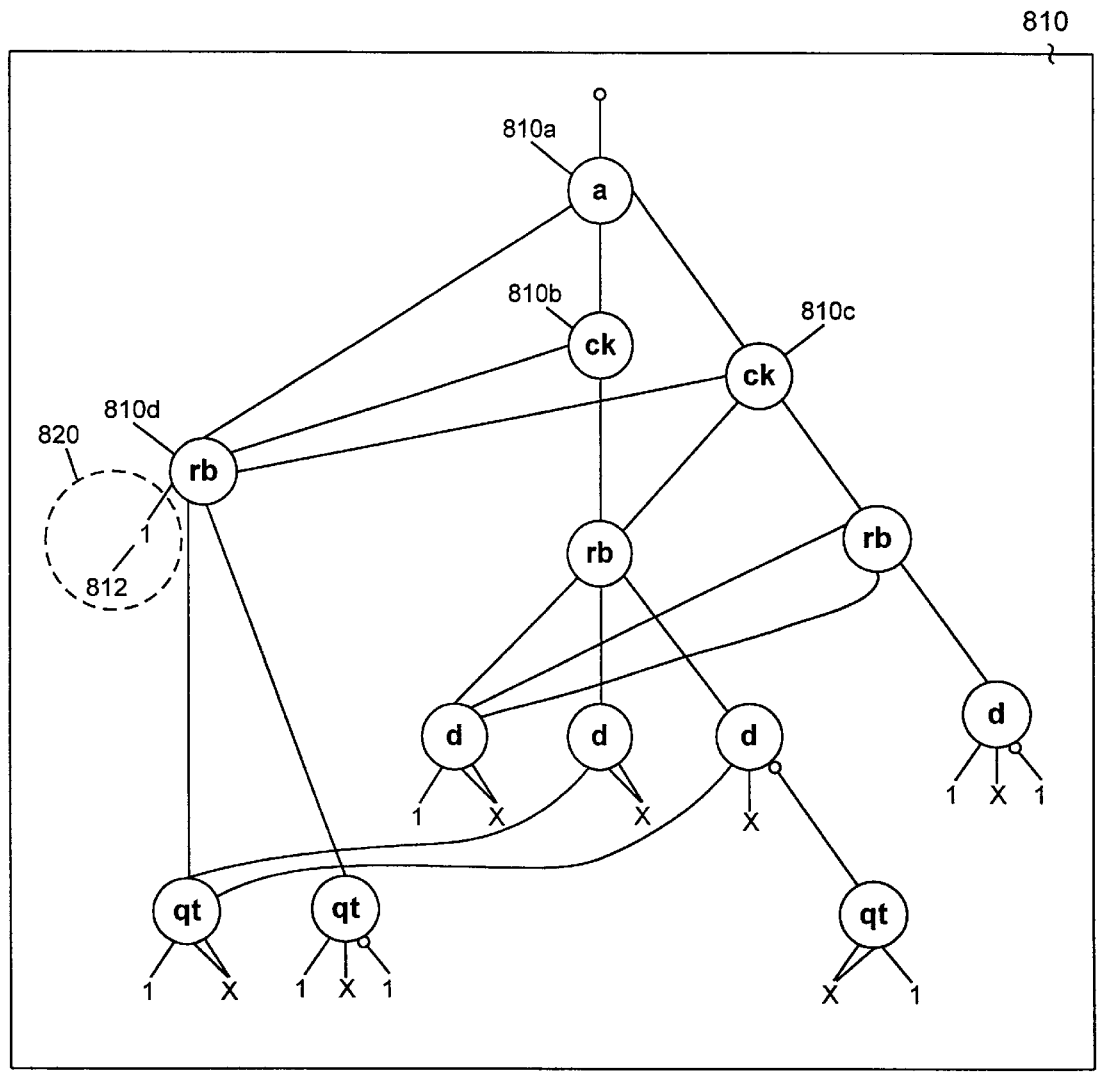
FIG. 20C illustrates the OTDD graph portion identified by the present invention for the "data-portion" of the first exemplary port of the table-based description of FIG. 14.

For instance, clocks "a" and "ck" are turned off and clock "rb" is turned on. FIG. 20C illustrates the resulting combinational OTDD portion 820. The left edge of node 810*a* is traversed (a=0) and the left edge of node 810*d* is traversed (because clock rb is on when rb=0) to leaf value 812. In this case, clock rb captures a "1" when it is on.

At step 715 of FIG. 19, input reordering is performed with respect to the combinational OTDD portion 820 (with computed leaf values). At step 715, the same input reordering process as described with respect to step 315 of FIG. 8 is performed on the combinational OTDD portion 820. At step 720 of FIG. 19, the present invention then extracts the prime non-redundant gate-level network of the combinational OTDD portion 820 (with computed leaf values). Step 720 is performed on combinational OTDD portion 820 using the same gate-level extraction process described with respect to process 320 of FIG. 10 and cube sets are computed as an intermediate step. At step 725, the present invention stores the determined gate-level network as the data function of the respective port (e.g., port-one). In this example, the extracted gate-level network is merely a constant data value. The clock and data portions of the respective port are now reduced to gate-level descriptions.

Step 555 of FIG. 13 then determines if more ports need to be processed. In this case, port-two remains to be processed, so at step 560, port-two is selected as the respective port. Step 545 is entered again.

Figure 20D:
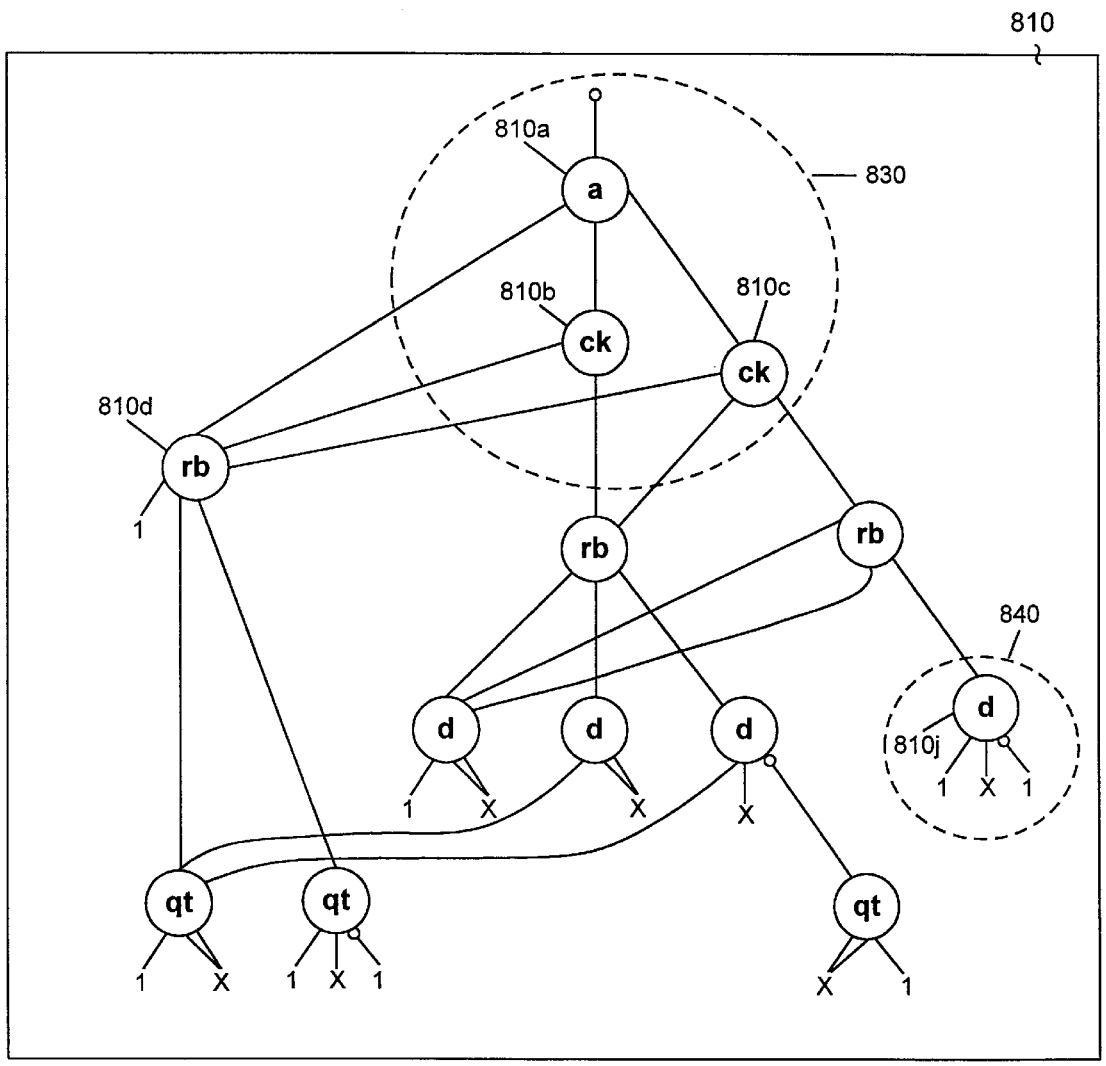
FIG. 20D illustrates the OTDD graph portions identified by the present invention for both the "clock-portion" and "data-portion" of a second exemplary port of the table-based description of FIG. 14.

FIG. 20D illustrates the combinational OTDD portion 830 which represents the clock portion of port-two. Portion 830 is found by step 545 placing clock "rb" in the offstate. The leaf values for OTDD portion 830 are computed as follows. The right most value is "1" because inputs a and ck are on. The middle is "x" and the left most is the offstate. Like port-one, input reordering and the extraction of a prime non-redundant gate-level network is performed on OTDD portion 830 to obtain the clock portion of port-two. In this example, the circuitry extracted is an AND gate.

FIG. 20D also illustrates the combinational OTDD portion 840 which represents the data portion of port-two. Portion 840 is found by step 550 placing clock "rb" in the offstate and placing the clocks "a" and "ck" in the on state. Like port-one, input reordering and the extraction of a prime non-redundant gate-level network is performed on OTDD portion 840 to obtain the clock portion of port-two. In this example, the circuitry extracted is the "d" input.

At step 555, process 265 of FIG. 13 returns. Once the number and nature (e.g., level or edge, set, reset, clock) of the ports are identified, the state element(s) are added to their gate-level descriptions.

Figures 21A, 21B:
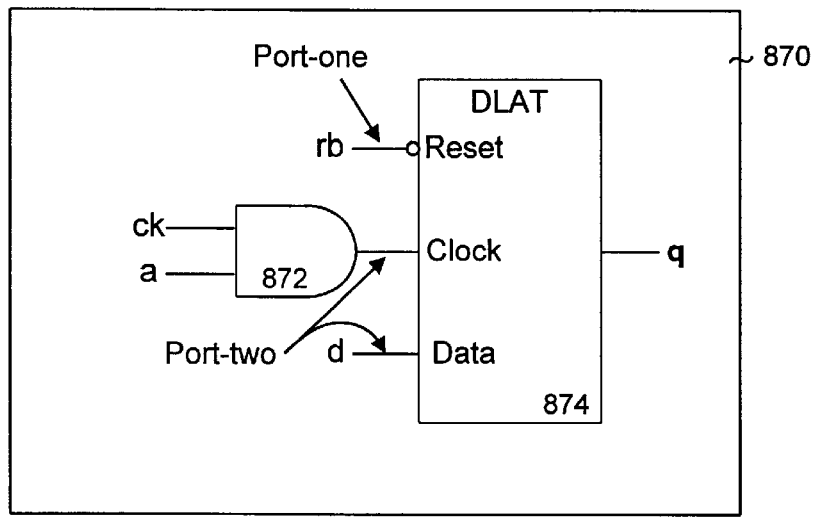
FIG. 21A is a gate-level representation of the table-based description of FIG. 14 generated in accordance with the present invention.
FIG. 21B a structural level description of the table-based description of FIG. 14 generated in accordance with the present invention.

The resulting gate-level description 870 of step 265 (FIG. 4), extracted from the UDP 212*b* in FIG. 14, is shown in FIG. 21A. It uses the target test generator's primitives __AND gate 872 (similar to Verilog's and, except that the output is last in the argument list) and __DLAT 874 (no Verilog primitive equivalent; with arguments: set, reset, clock, data, output). The "rb" input is inverted because "rb" is active low, but the reset input of the DLAT is active high. Port-one and port-two are also enumerated.

When the gate-level sequential description 870 is complete, it is extracted by step 270 (FIG. 4) into a second OTDD graph and compared to the complete sequential OTDD graph 810 extracted from the sequential UDP 212*b*. If this formal verification 270 detects errors, the gate-level description 870 may be replaced with a "black box".

FIG. 21B illustrates the equivalent structural-level description 885 generated by step 275 of FIG. 4 for the gate-level representation 870 of FIG. 21A.

Formal Verification of Extracted Gate-level Description

Figure 22:
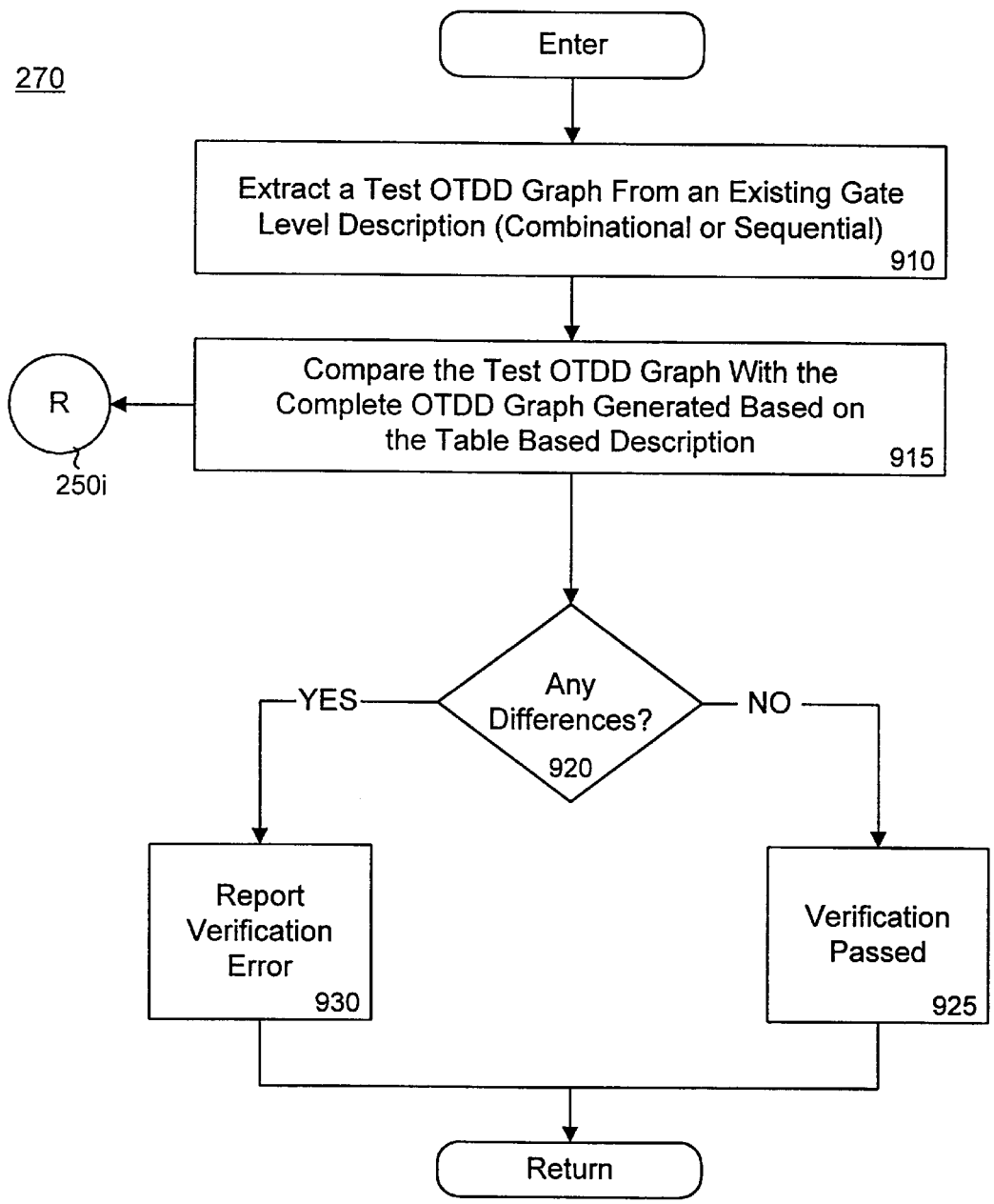
FIG. 22 is a flow diagram of steps of the OTDD verification process of FIG. 5 in accordance with the present invention.

FIG. 22 is a flow diagram of steps of the OTDD verification process 270 of FIG. 4 in accordance with the present invention. Process 270 operates on gate-level descriptions 232 generated from either a combinational or sequential UDP. At step 910, the present invention extracts a test OTDD graph from an existing gate-level description (either combinational or sequential). The test OTDD graph extracted is not in the format of the "clock OTDD." At step 915, the present invention compares the functionalities of the test OTDD graph with the complete OTDD graph generated by either step 310 (for combinational UDP) or by step 525 (for a sequential UDP). Step 915 also generates certain design rule checking results 250*i*. At step 920, if differences in functionalities are detected from step 915, then step 930 is entered where a verification error is reported and the current gate-level description for the UDP may be replaced with a "black box." At step 920, if differences in functionalities are not detected from step 915, then step 925 is entered where a verification pass flag is set as associated with gate-level description 232.

Design Rule Checking

Many steps of the automatic generator 230 of the present invention also optionally output rules-checking results 250*a*–250*i*. At any point, fatal rule failures can cause the next steps to be bypassed and a "black-box" gate-level description 232 is output by the present invention. However, most common rule violations are not fatal and can be grouped into two broad classes. The first class is rule violations caused by incomplete, ambiguous or contradictory table entries and these can be used by the library designer to correct the table model 212. The second class is rule violations caused by table functionality that cannot be fully represented with the targeted set of logical gates. If this functionality is considered to be irrelevant (such as simulation-only timing checks), it is dropped from the gate-level description 232. However, if the functionality is relevant, the gate-level description 232 selects on the conservative (e.g., pessimistic) side.

In addition to the rules cited above, the automatic generator 230 is driven by "hard" usability rules. For example, it is imperative that the created gate-level descriptions 232 do not contain any feedback paths not broken by at least a flip-flop or two latches clocked out-of-phase. Otherwise, the description will represent a timing-dependent oscillator or pulse shaper instead of a synchronous state machine. This limitation of the automatic generator 230 is justified by the fact that table descriptions by themselves do not contain timing information and the gate-level model created will be used by timing-insensitive tools such as test generation or formal verification.

The categories of rules checked can be grouped according to the steps performed by the automatic generator 230 and are described next.

Parsing Rules, Step 245 of FIG. 4. Parsing rules are checked as the current UDP is parsed. They include syntax errors, missing constructs, as well as context-sensitive rules such as Verilog UDPs not being allowed to include more than one edge per entry.

Extraction Rules, Steps 320 and 535. Extraction rules check completeness and x-consistency. Combinational completeness is based on the observation that a network of Boolean gates has a Boolean output for any possible Boolean inputs. The table representation 212 needs be combinationally complete. The example 940 in FIG. 23A violates this rule because the input combinations (1 ?) are missing from the table; thus, the output is implicitly x. Sequential completeness adds edge checking based on the requirement that all relevant edge transitions must be described in the table 212. The x-consistency checks that all table entries with at least one x (including implicit table entries for the unspecified combinations) treat the x as a don't care between 0 and 1. The example 940 in FIG. 23A violates this rule because the input (0 x) produces output 0, but (0 0) produces output 1. Thus, this UDP 940 has no gate-level representation and is physically unrealizable.

Clock-Identification Rules, Step 515. The clock and data inputs identified from the clock OTDD graph 580 must be consistent with all entries in the current UDP. For example, consider the version 945 of the table from FIG. 14 shown in FIG. 23B. The fourth table entry shows an offstate when rb=x, which is inconsistent with "rb" being a level-sensitive clock. In this case, the error is rather obvious from an inspection of the table 945; however, in larger more complex tables with edge-sensitive entries, such an error is easily overlooked.

Port-Separation Rules, Step 530. During port identification and separation, all interactions between ports of a multi-ported latch or flip-flop are analyzed. For example, two or more level-sensitive ports can be active at once and, if the corresponding data inputs have the same value, the output will take that value too. In general, ports can share clock and data circuitry, which makes their interaction more complex.

State-Element Identification Rules, Step 535. The number and type of state elements (latches or flip-flops) is derived from the number and type of clocks. If all clocks are level-sensitive, then the state element is a single latch. If all clocks are edge-sensitive, with the possible exceptions of level-sensitive set and reset, then the state element is a single flip-flop. Other mixtures of clock types may result in two latches or in a erroneous condition.

Verification rules, Step 270. The formal verification performed after the extraction is completed identifies any under- or over-specification of the UDP table versus the gate-level description. For example, the third line (???0:?:0i/>>>>a=?<<<<) of the table 945 in FIG. 23B generates two violations: (d=? a=1 ck=1 rb=0) and (d=? a=1 ck=x rb=0) both result in the table output being 0; but, in the gate-level representation 870 of FIG. 21A, the output is 0 only if "d" is also 0.

Conclusion

The automatic generator 230 of the present invention allows significant automation of the design process by reducing or eliminating the engineering-intensive tasks of creating and validating a test library including gate-level 232 and structural-level 234 descriptions (FIG. 3). The already signed-off simulation library 210 is read and converted to efficient gate-level models 232, used directly for input to test tools 220*a*. Test-generation 220*a* and rules-checking are linked through the automatic generator 230 into the main loop of logic design, verification, and low-level design. The automatic generator 230 also performs rigorous rules checking, which allows custom library models to be created faster and cleaner by identifying and removing incomplete or ambiguous specifications.

For tools other than test-generation that require structural rather than simulation library models, a structural netlist 234 can be written out in Verilog or other formats, containing primitives of the target tool and, in effect, automating the process of creating a structural library. While one application of the automatic generator 230 is to process the vast database of existing simulation libraries 210, the rules checker can also become a part of the simulation library creation process. This integration is important if test generation, test synthesis, logic synthesis and verification are to interact closely in an unified design environment.

The preferred embodiment of the present invention, a system and method for automatic generation of gate-level descriptions from table-based descriptions within the field of electronic design automation, is thus described. While the present invention has been described in particular embodiments, it should be appreciated that the present invention should not be construed as limited by such embodiments, but rather construed according to the below claims.

What is claimed is:

1. A computer implemented method for generating a gate-level description of an integrated circuit cell, said method comprising the steps of:

a) accessing a simulation library to obtain a table-based description of said integrated circuit cell, said simulation library stored in a memory unit;

b) determining whether said table-based description describes a combinational circuit or a sequential circuit;

c) if said table-based description describes a combinational circuit, automatically generating a complete combinational ordered ternary decision diagram (OTDD) graph of said table-based description and automatically generating a gate-level description of said table-based description based on said complete combinational OTDD graph;

d) if said table-based description describes a sequential circuit, automatically generating a gate-level description of said table-based description based on a clock OTDD graph of said table-based description and also based on a complete sequential OTDD graph of said table-based description; and e) storing said gate-level description of said table-based description in a first library stored in said memory unit.

2. A method as described in claim 1 further comprising the steps of:
    accessing said gate-level description of said table-based description from said first library;
    automatically translating said gate-level description of said table-based description into a structural-level description; and
    storing said structural-level description into a library stored in said memory unit.

3. A method as described in claim 1 further comprising the steps of:
    translating said gate-level description of said table-based description into a test OTDD graph;
    if said table-description describes a combinational circuit, comparing said complete combinational OTDD graph against said test OTDD graph for differences in functionality;
    if said table-description describes a sequential circuit, comparing said complete sequential OTDD graph against said test OTDD graph for differences in functionality; and
    generating a verification error provided any differences in functionality are determined.

4. A method as described in claim 1 wherein said step c) comprises the steps of:
    c1) translating said table-based description into a first combinational OTDD graph;
    c2) reordering inputs of said first combinational OTDD graph to generate said complete combinational OTDD graph;
    c3) generating prime, non-redundant, minimized cube sets based on said complete combinational OTDD graph and recognizing high level functions; and
    c4) generating said gate-level description of said table-based description based on said cube sets of said step c3) and any high level functions recognized.

5. A method as described in claim 4 wherein said step c2) comprises the steps of:
    generating a mutual controllability matrix having controllability pairs wherein each controllability pair is relevant for two inputs, "a" and "b;" and
    reordering said inputs to reduce instances within said complete combinational OTDD graph where, based on said mutual controllability matrix, input "a" controls input "b," but input "b" precedes input "a."

6. A method as described in claim 4 wherein said step c3) comprises the steps of:
    recognizing said high level functions by matching patterns of nodes and edges of said complete combinational OTDD graph against predetermined patterns;
    determining a plurality of cubes by traversing respective paths of said complete combinational OTDD from a top node to a leaf and ANDing inputs of said respective paths;
    eliminating redundant cubes from said plurality of cubes; and
    determining said cube sets by ORing said plurality of cubes.

7. A method as described in claim 1 wherein said step d) comprises the steps of:
    d1) generating said clock OTDD graph of said table-based description to identify clock and data inputs and to characterize said clock inputs of said table-based description;
    d2) generating said complete sequential OTDD graph wherein said clock inputs are ordered before said data inputs;
    d3) identifying a sequential element for said table-based description;
    d4) identifying clock inputs belonging to respective ports of said table-based description;
    d5) generating gate-level descriptions of a clock portion and of a data portion for each respective port identified in step d4); and
    d6) combining said identified sequential element of step d3) with said gate-level descriptions of said step d5).

8. A method as described in claim 7 wherein each node of said clock OTDD graph represents a clock input and comprises:
    a left edge representing both a value of logical 0 and a signal transition from a logical 1 to a logical 0 for said clock input;
    a middle edge representing both a logical 0 and a logical 1 for said clock input; and
    a right edge representing both a value of logical 1 and a signal transition from a logical 0 to a logical 1 for said clock input.

9. A method as described in claim 7 wherein said step d1) comprises the steps of:
    identifying, as clock inputs, those inputs that have corresponding nodes within said clock OTDD graph and identifying, as data inputs, those inputs that are not clock inputs;
    identifying a respective clock input's offstate by determining the clock function required to traverse said clock OTDD graph from a node of said respective clock input to a "0" leaf of said clock OTDD graph;
    identifying edge triggered clock inputs by determining which nodes of said clock OTDD graph have middle edges that lead to an offstate; and
    identifying level sensitive clock inputs by determining which nodes of said clock OTDD graph have middle edges that lead to an on state.

10. A method as described in claim 7 wherein said step d3) comprises the step of identifying a latch sequential element if all clock inputs within said clock OTDD graph are level sensitive, otherwise identifying a flip-flop sequential circuit or two or more latch sequential elements.

11. A method as described in claim 7 wherein said step d5) comprises the steps of:
    generating a gate-level description of said clock portion of a respective port by:
        identifying a first portion of said complete sequential OTDD graph by turning off clock inputs not associated with said respective port; and
        extracting a prime, reduced and minimal gate-level description of said first portion using cube sets; and
    generating a gate-level description of said data portion of said respective port by:
        identifying a second portion of said complete sequential OTDD graph by turning off clock inputs that are not associated with said respective port and turning on clock inputs that are associated with said respective port; and
        extracting a prime, reduced and minimal gate-level description of said second portion using cube sets.

12. A method as described in claim 7 wherein said step d4) comprises the steps of:
    assigning a single clock input to a single port provided said single clock input can independently capture data; and grouping clock inputs with a respective port if said clock inputs are not capable of independently capturing data.

13. A computer system comprising a processor coupled to a bus and a memory unit coupled to said bus, said memory unit having stored therein instructions that when executed implement a method for generating a gate-level description of an integrated circuit cell, said method comprising the steps of:

a) accessing a simulation library to obtain a table-based description of said integrated circuit cell, said simulation library stored in said memory unit;

b) determining whether said table-based description describes a combinational circuit or a sequential circuit;

c) if said table-based description describes a combinational circuit, automatically generating a complete combinational ordered ternary decision diagram (OTDD) graph of said table-based description and automatically generating a gate-level description of said table-based description based on said complete combinational OTDD graph;

d) if said table-based description describes a sequential circuit, automatically generating a gate-level description of said table-based description based on a clock OTDD graph of said table-based description and also based on a complete sequential OTDD graph of said table-based description; and e) storing said gate-level description of said table-based description in a first library stored in said memory unit.

14. A computer system as described in claim 13 wherein said method further comprises the steps of:

accessing said gate-level description of said table-based description from said first library;

automatically translating said gate-level description of said table-based description into a structural-level description; and storing said structural-level description into a library stored in said memory unit.

15. A computer system as described in claim 13 wherein said method further comprises the steps of:

translating said gate-level description of said table-based description into a test OTDD graph;

if said table-description describes a combinational circuit, comparing said complete combinational OTDD graph against said test OTDD graph for differences in functionality;

if said table-description describes a sequential circuit, comparing said complete sequential OTDD graph against said test OTOD graph for differences in functionality; and generating a verification error provided any differences in functionality are determined.

16. A computer system as described in claim 13 wherein said step c) of said method comprises the steps of:

c1) translating said table-based description into a first combinational OTDD graph;

c2) reordering inputs of said first combinational OTDD graph to generate said complete combinational OTDD graph;

c3) generating prime, non-redundant, minimized cube sets based on said complete combinational OTDD graph and recognizing high level functions; and c4) generating said gate-level description of said table-based description based on said cube sets of said step c3) and any high level functions recognized.

17. A computer system as described in claim 16 wherein said step c2) of said method comprises the steps of:

generating a mutual controllability matrix having controllability pairs wherein each controllability pair is relevant for two inputs, "a" and "b;" and reordering said inputs to reduce instances within said complete combinational OTDD graph where, based on said mutual controllability matrix, input "a" controls input "b," but input "b" precedes input "a."

18. A computer system as described in claim 16 wherein said step c3) of said method comprises the steps of:

recognizing said high level functions by matching patterns of nodes and edges of said complete combinational OTDD graph against predetermined patterns;

determining a plurality of cubes by traversing respective paths of said complete combinational OTDD from a top node to a leaf and ANDing inputs of said respective paths;

eliminating redundant cubes from said plurality of cubes; and determining said cube sets by ORing said plurality of cubes.

19. A computer system as described in claim 13 wherein said step d) of said method comprises the steps of:

d1) generating said clock OTDD graph of said table-based description to identify clock and data inputs and to characterize said clock inputs of said table-based description;

d2) generating said complete sequential OTDD graph wherein said clock inputs are ordered before said data inputs;

d3) identifying a sequential element for said table-based description;

d4) identifying clock inputs belonging to respective ports of said table-based description;

d5) generating gate-level descriptions of a clock portion and of a data portion for each respective port identified in step d4); and d6) combining said identified sequential element of step d3) with said gate-level descriptions of said step d5).

20. A computer system as described in claim 19 wherein each node of said clock OTDD graph represents a clock input and comprises:

a left edge representing both a value of logical 0 and a signal transition from a logical 1 to a logical 0 for said clock input;

a middle edge representing both a logical 0 and a logical 1 for said clock input; and a right edge representing both a value of logical 1 and a signal transition from a logical 0 to a logical 1 for said clock input.

21. A computer system as described in claim 19 wherein said step d1) of said method comprises the steps of:

identifying, as clock inputs, those inputs that have corresponding nodes within said clock OTDD graph and identifying, as data inputs, those inputs that are not clock inputs;

identifying a respective clock input's offstate by determining the clock function required to traverse said clock OTDD graph from a node of said respective clock input to a "0" leaf of said clock OTDD graph;

identifying edge triggered clock inputs by determining which nodes of said clock OTDD graph have middle edges that lead to an offstate; and identifying level sensitive clock inputs by determining which nodes of said clock OTDD graph have middle edges that lead to an on state.

22. A computer system as described in claim 19 wherein said step d3) of said method comprises the step of identifying a latch sequential element if all clock inputs within said clock OTDD graph are level sensitive, otherwise identifying a flip-flop sequential circuit.

23. A computer system as described in claim 19 wherein said step d5) of said method comprises the steps of:

generating a gate-level description of said clock portion of a respective port by:
identifying a first portion of said complete sequential OTDD graph by turning off clock inputs not associated with said respective port; and
extracting a prime, reduced and minimal gate-level description of said first portion using cube sets; and generating a gate-level description of said data portion of said respective port by:
identifying a second portion of said complete sequential OTDD graph by turning off clock inputs that are not associated with said respective port and turning on clock inputs that are associated with said respective port; and
extracting a prime, reduced and minimal gate-level description of said second portion using cube sets.

24. A computer system as described in claim 19 wherein said step d4) of said method comprises the steps of:

assigning a single clock input to a single port provided said single clock input can independently capture data; and grouping clock inputs with a respective port if said clock inputs are not capable of independently capturing data.

25. A computer implemented method for generating a gate-level description of an integrated circuit cell, said method comprising the steps of:

a) accessing a table-based description of said integrated circuit cell;

b) determining whether said table-based description describes a combinational circuit or a sequential circuit;

c) if said table-based description describes a combinational circuit, automatically generating a complete combinational ordered ternary decision diagram (OTDD) graph of said table-based description and automatically generating a gate-level description of said table-based description based on said complete combinational OTDD graph, wherein each node of said complete combinational OTDD graph represents an input and comprises: a left edge representing a value of logical 0 for said input; a middle edge representing a value of don't care for said input; and a right edge representing a value of logical 1 for said input; and d) if said table-based description describes a sequential circuit, automatically generating a gate-level description of said table-based description based on a clock OTDD graph of said table-based description and also based on a complete sequential OTDD graph of said table-based description, wherein each node of said clock OTDD graph represents a clock input and comprises: a left edge representing both a value of logical 0 and a signal transition from a logical 1 to a logical 0 for said clock input; a middle edge representing both a logical 0 and a logical 1 for said clock input; and a right edge representing both a value of logical 1 and a signal transition from a logical 0 to a logical 1 for said clock input.

26. A method as described in claim 25 wherein said step c) comprises the steps of:

c1) translating said table-based description into a first combinational OTDD graph;

c2) reordering inputs of said first combinational OTDD graph to generate said complete combinational OTDD graph;

c3) generating prime, non-redundant, minimized cube sets based on said complete combinational OTDD graph and recognizing high level functions; and c4) generating said gate-level description of said table-based description based on said cube sets of said step c3) and any high level functions recognized.

27. A method as described in claim 25 wherein said step d) comprises the steps of:

d1) generating said clock OTDD graph of said table-based description to identify clock and data inputs and to characterize said clock inputs of said table-based description;

d2) generating said complete sequential OTDD graph wherein said clock inputs are ordered before said data inputs;

d3) identifying a sequential element for said table-based description;

d4) identifying clock inputs belonging to respective ports of said table-based description;

d5) generating gate-level descriptions of a clock portion and of a data portion for each respective port identified in step d4); and d6) combining said identified sequential element of step d3) with said gate-level descriptions of said step d5).

* * * * *